(12) United States Patent
Zimmer et al.

(10) Patent No.: US 8,378,357 B2
(45) Date of Patent: Feb. 19, 2013

(54) MULTILAYERED STRUCTURES AND METHODS OF MAKING MULTILAYERED STRUCTURES

(75) Inventors: Jerry Wayne Zimmer, Santa Ros, CA (US); Gerard James Chandler, Fremont, CA (US)

(73) Assignee: SP3, Inc., Santa Clara, CA (US)

( * ) Notice: Subject to any disclaimer, the term of this patent is extended or adjusted under 35 U.S.C. 154(b) by 0 days.

(21) Appl. No.: 13/436,974

(22) Filed: Apr. 1, 2012

(65) Prior Publication Data

US 2012/0231216 A1 Sep. 13, 2012

Related U.S. Application Data

(60) Continuation-in-part of application No. 13/068,616, filed on May 16, 2011, now Pat. No. 8,147,927, which is a division of application No. 11/897,204, filed on Aug. 28, 2007, now Pat. No. 8,105,693.

(51) Int. Cl.
*B32B 9/00* (2006.01)

(52) U.S. Cl. .......... 257/77; 427/577; 428/216; 428/336; 428/408

(58) Field of Classification Search .................... 257/77; 428/216, 336, 408, 459; 427/577
See application file for complete search history.

(56) References Cited

U.S. PATENT DOCUMENTS

| | | |
|---|---|---|
| 4,783,368 A | 11/1988 | Yamamoto et al. |
| 5,244,712 A | 9/1993 | Eden |
| 5,472,787 A | 12/1995 | Johnson et al. |
| 5,500,248 A | 3/1996 | Iacovangelo et al. |
| 5,567,985 A | 10/1996 | Iacovangelo et al. |
| 5,645,937 A | 7/1997 | Noda et al. |
| 5,900,127 A | 5/1999 | Iida et al. |
| 6,306,270 B1 | 10/2001 | Hanni et al. |
| 6,531,226 B1 | 3/2003 | Petkie |
| 6,998,180 B2 | 2/2006 | Ludtke et al. |

FOREIGN PATENT DOCUMENTS

WO   WO 01/6967 A2   9/2001

OTHER PUBLICATIONS

Jaganndham, Multilayer Diamond Heat Spreaders for Electronic Power Devices, Solid-State Electronics vol. 42, No. 12, pp. 2199-2208, 1998.
Quagan, Diamond cools high-power emitters, LaserFocusWorld, pp. 1-6, 2005.
Anonymous, Method for a thermally enhanced stack-die package with a diamond interposer, IP.com, 2007.

*Primary Examiner* — A. A. Turner
(74) *Attorney, Agent, or Firm* — Robert Moll

(57) ABSTRACT

The present invention relates to a multilayered structure including at least one diamond layer and methods of making the multilayered structures. The multilayered structure includes a diamond layer having a top surface and a bottom surface, and when desired at least one metal filled via in the diamond layer, a first thin adhesion layer on the top surface, a second thin adhesion layer on the bottom surface, a first metal layer having a thermal conductivity greater than 200 W/m-K and a coefficient of thermal expansion greater than 12 ppm/K, wherein the first metal layer is deposited on the first thin adhesion layer, and a second metal layer having a thermal conductivity greater than 200 W/m-K and a coefficient of thermal expansion greater than 12 ppm/K, wherein the second metal layer is deposited on the second thin adhesion layer.

37 Claims, 14 Drawing Sheets

MULTILAYERED STRUCTURES AND METHODS OF MAKING MULTILAYERED STRUCTURES

This application is a continuation-in-part of U.S. Application No. 13/068,616, Methods of Making Multilayered Structures, filed on May 16, 2011, issuing as U.S. Pat. No. 8,147,927 B2, which is a divisional of U.S. application Ser. No. 11/897,204, Multilayered Structures and Methods Thereof, filed on Aug. 29, 2007, now U.S. Pat. No. 8,105,693 B2, which are incorporated by reference herein.

BACKGROUND

This invention relates to multilayered structures having one or more diamond layers and methods of making the multilayered structures.

An important problem in the electronics industry is how to dissipate the heat generated from a semiconductor device. The thermal energy must be sufficiently removed to avoid performance degradation or even failure. One mechanism involving heat transfer by conduction places a material referred to as a heat spreader adjacent to the semiconductor device. The rate of removal depends on the heat spreader's thermal conductivity and the thermal resistance of the bonding material between the semiconductor device and the heat spreader.

Diamond has desirable properties that should be useful in a heat spreader including high thermal conductivity, low electrical conductivity, high Young's modulus, wide bandwidth optical and EMR transmission, and extreme corrosion resistance.

Diamond's properties are difficult to exploit, however, because they do not match semiconductor devices' or metals' properties. For example, diamond's thermal conductivity is several times larger than copper or silver. Diamond's coefficient of thermal expansion is also substantially lower than that of many semiconductor devices. These differences also limit the bonding materials that can be used to avoid cracking or bending the semiconductor devices. Unfortunately, bonding materials that could be used have poor thermal conductivity and other problems such as electromigration and material creep effects. These problems limit the performance and reliability of the semiconductor device.

There exists a need for a structure that has a thermal conductivity which is similar to diamond and a coefficient of thermal expansion which can be matched to various semiconductor materials such as silicon, silicon carbide, gallium arsenide, and gallium nitride. Some products attempt to match the thermal expansion using copper layers bonded to both sides aluminum nitride or beryllium oxide. However, they have thermal conductivities which are typically no higher than their ceramic layer. Further, they must have thick layers of copper to attempt to match the expansion which limits the ability for patterned and electrically isolated regions on mounting surfaces.

SUMMARY OF INVENTION

The present invention relates to a multilayered structure having one or more diamond layers and methods of making the multilayered structures.

In an embodiment, the multilayered structure includes a diamond layer having a top surface and a bottom surface, and may (or may not) include one or more metal filled vias, a first adhesion layer on the top surface, a second adhesion layer on the bottom surface, a first metal layer having a thermal conductivity greater than 200 W/m-K and a coefficient of thermal expansion greater than 12 ppm/K, wherein the first metal layer is deposited on the first adhesion layer, and a second metal layer having a thermal conductivity greater than 200 W/m-K and a coefficient of thermal expansion greater than 12 ppm/K, wherein the second metal layer is deposited on the second adhesion layer.

In another embodiment, the invention relates to a method of making a multilayered structure including growing a diamond layer on a substrate, and if desired, forming one or more metal filled vias in the diamond layer, applying a first adhesion layer to the diamond layer, applying a first metal layer on the first adhesion layer, removing the substrate, applying a second adhesion layer to the diamond layer, and applying a second metal layer on the second adhesion layer such that the first and second metal layers are the outer layers of the multilayered structure.

DETAILED DESCRIPTION OF PREFERRED EMBODIMENTS

The following description includes the best mode of carrying out the invention, illustrates the principles of the invention, uses illustrative values, and should not be taken in a limiting sense. The scope of the invention is determined by reference to the claims. Each part or step is assigned its own number in the specification and drawings. The drawings are not to scale and do not reflect the relative thickness of any of the layers.

The invention provides a multilayered structure that has the desired thermal conductivity and coefficient of thermal expansion and the ability for finer patterning and electrical isolation of the outer metal layers. One aspect of the invention therefore is to reduce the thickness of the diamond which also reduces the required thickness of the metal layer(s). This aspect could be embodied in a multilayered structure including a high CTE metal layer such as a copper layer, a diamond layer, and another high CTE metal layer as shown in FIG. 1A.

Figure 1A:
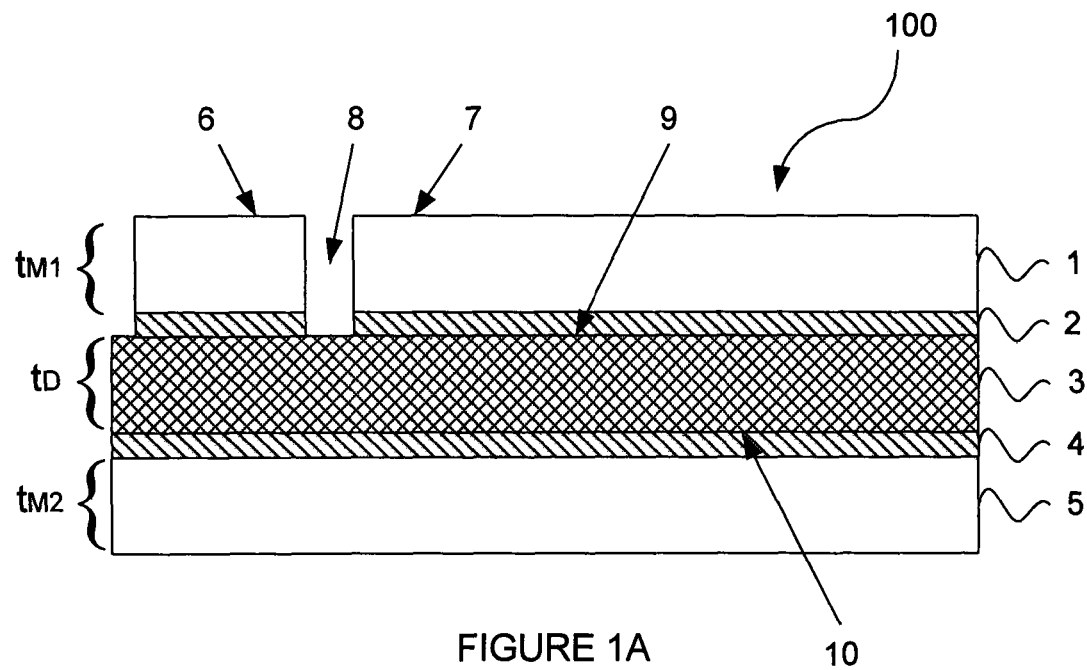
FIG. 1A is a cross-sectional view of an embodiment of a multilayered structure that has one diamond layer.

FIG. 1A illustrates a cross-sectional view of an embodiment of a multilayered structure 100 that has a diamond layer 3. As shown, the diamond layer 3 has a top surface 9 and a bottom surface 10. A first thin adhesion layer 2 is disposed on the top surface 9 and a second thin adhesion layer 4 is on the bottom surface 10. A first metal layer 1 having a thermal conductivity greater than 200 W/m-K and a coefficient of thermal expansion greater than 12 ppm/K where the first metal layer 1 is deposited on the first thin adhesion layer 2. A second metal layer 5 having a thermal conductivity greater than 200 W/m-K and a coefficient of thermal expansion greater than 12 ppm/K is deposited on the second thin adhesion layer 4.

Figure 1B:
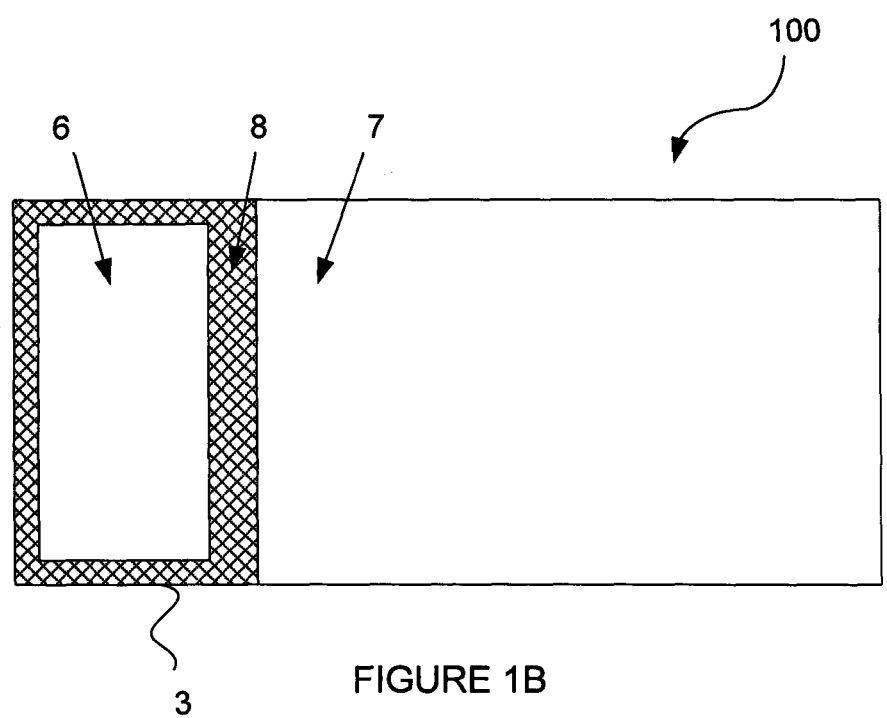
FIG. 1B is a top view of the multilayered structure of FIG. 1A.

FIG. 1B is a top view of the multilayered structure 100 of FIG. 1A. The first metal layer 1 and the first thin adhesion layer 2 can be patterned using standard semiconductor processes such as photolithography into one or more electrically isolated regions. As shown, the first metal layer 1 and the first thin adhesion layer 2 are patterned into two electrically isolated regions 6 and 7 which form a gap 8 and expose the diamond layer 3.

The following CTE matching equation (1) can be used to determine the thickness of the diamond layer in the multilayered structure illustrated in FIG. 1A:

$$t_D = t_{M1} \times (E_D/E_{M1}) \times ((CTE_{M1} - CTE_C)/(CTE_C - CTE_D)) + t_{M2} \times (E_D/E_{M2}) \times ((CTE_{M2} - CTE_C)/(CTE_C - CTE_D)),$$ where the variables:

$t_D$ = thickness of the diamond layer
$t_{M1}$ = thickness of the first metal layer
$t_{M2}$ = thickness of the second metal layer
$E_D$ = Young's modulus of the diamond layer
$E_{M1}$ = Young's modulus of the first metal layer
$E_{M2}$ = Young's modulus of the second metal layer
$CTE_D$ = coefficient of thermal expansion of the diamond layer
$CTE_{M1}$ = coefficient of thermal expansion of the first metal layer
$CTE_{M2}$ = coefficient of thermal expansion of the second metal layer
$CTE_C$ = coefficient of thermal expansion of the surface of the multilayered structure.

The CTE matching equation (1) can be executed in PC software such as Microsoft Excel Solver to determine the thickness of the metal and diamond layers as long as thin adhesion layers are used. For example, each adhesion layer is preferably relatively thin (less than 10%) compared to the thickness of each of the outer metal layers. A thin adhesion layer may be between 10-1000 nanometers, and preferably between 50-500 nanometers. Also see example 1 below.

Figure 2:
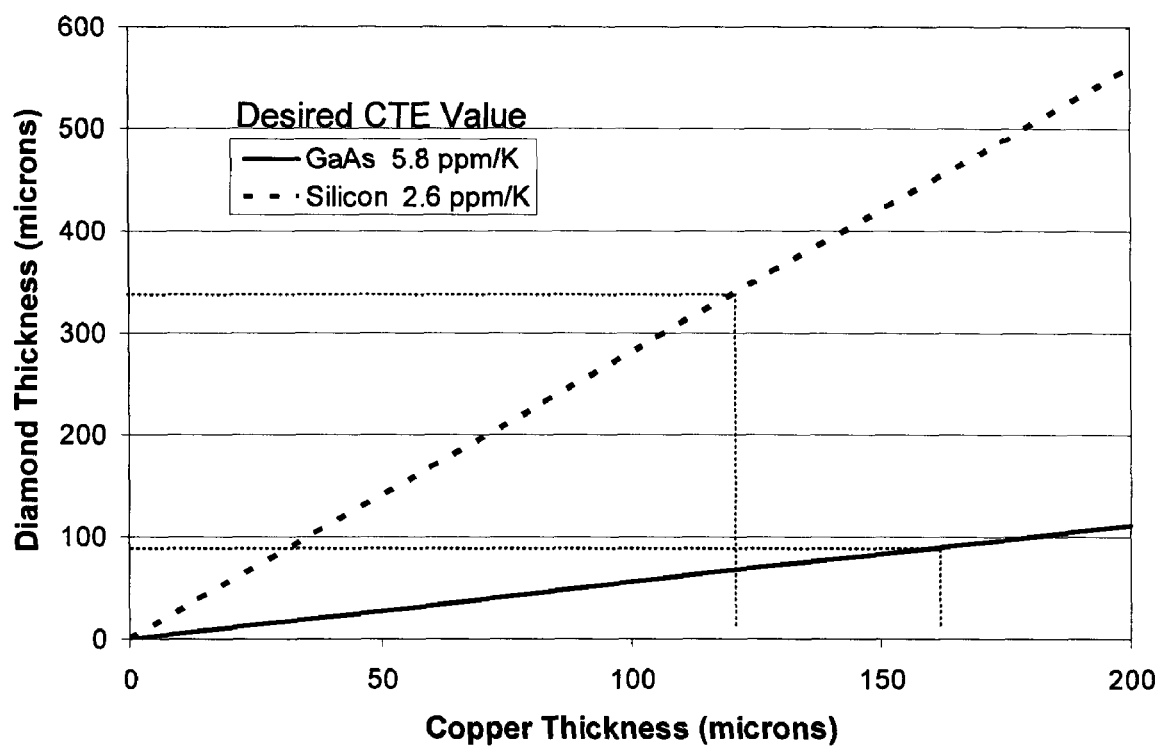
FIG. 2 is a graph of the relative thickness of diamond and copper to use in a multilayered structure to match GaAs and silicon's coefficients of thermal expansion.

FIG. 2 is a graph that could be obtained by inserting physical properties of the layers (e.g., Young's modulus) into the CTE matching equation (1). Referring to FIG. 2, we can see the relative thickness of diamond and copper to use in a multilayered structure when the metal layers have the same thickness. The solid line plots the relative thickness for a GaAs device while the dotted line plots the relative thickness for a silicon device. For example, a 340 micron diamond layer requires a 120 micron copper layer for a silicon device. In another example, a 90 micron diamond layer requires a 160 micron copper layer for a GaAs device. This type of graph could be also constructed for other metal layers.

Figure 3A:
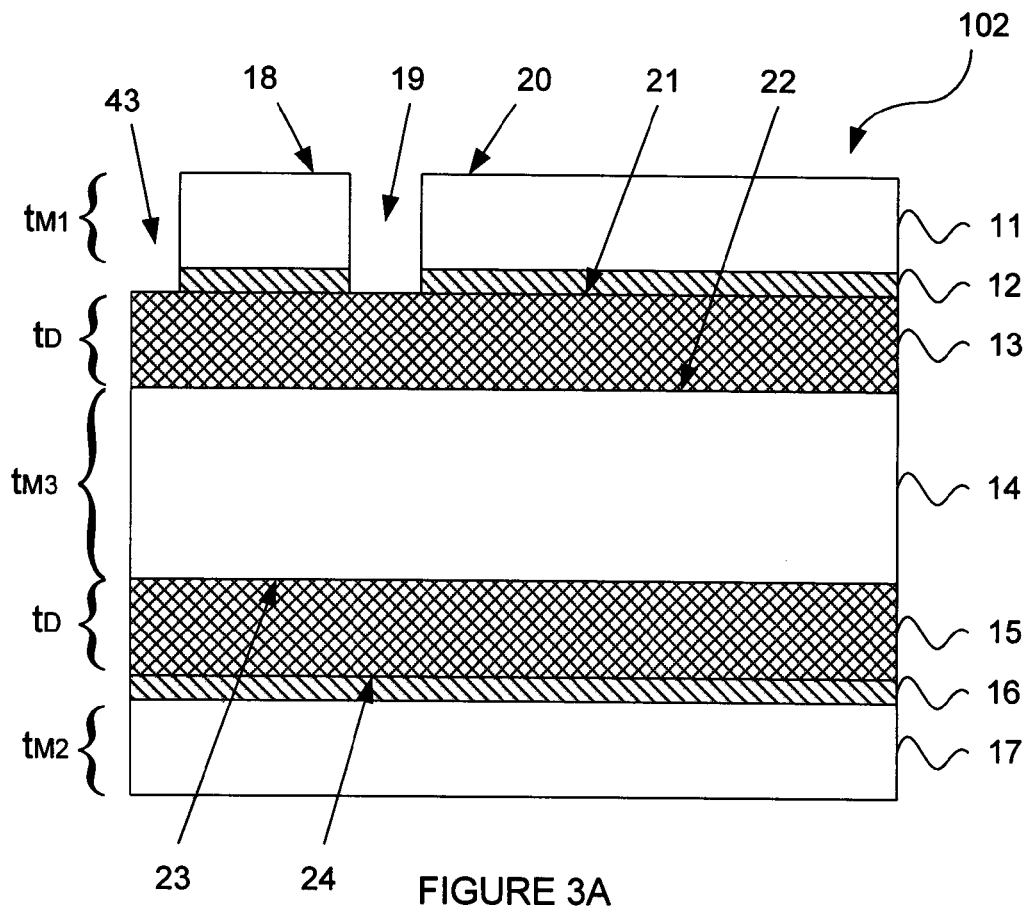
FIG. 3A is a cross-sectional view of an embodiment of the multilayered structure that has an inner metal layer between two diamond layers.

FIG. 3A illustrates a cross-sectional view of an embodiment of a multilayered structure 102 that has two diamond layers. As shown, the multilayered structure 102 includes an inner metal layer 14 having a thermal conductivity greater than 200 W/m-K and a coefficient of thermal expansion greater than 12 ppm/K. The first diamond layer 13 is bonded to the top surface 22 of the inner metal layer 14 and the second diamond layer 15 is bonded to the bottom surface 23 of the inner metal layer 14. In this application, we note that one of ordinary skill can bond a diamond layer to a metal layer using various semiconductor and/or brazing processes and what process is used is not essential to the invention. Example 2 (see below) describes one known process of vacuum brazing to bond the diamond layer to the metal layer. A first thin adhesion layer 12 is deposited on the top surface 21 of the first diamond layer 13 and a second thin adhesion layer 16 is deposited on the bottom surface 24 of the second diamond layer 15. A first outer metal layer 11 having a thermal conductivity greater than 200 W/m-K and a coefficient of thermal expansion greater than 12 ppm/K is deposited on the first thin adhesion layer 12 and a second outer metal layer 17 having a thermal conductivity greater than 200 W/m-K and a coefficient of thermal expansion greater than 12 ppm/K is deposited on the second thin adhesion layer 16.

Figure 3B:
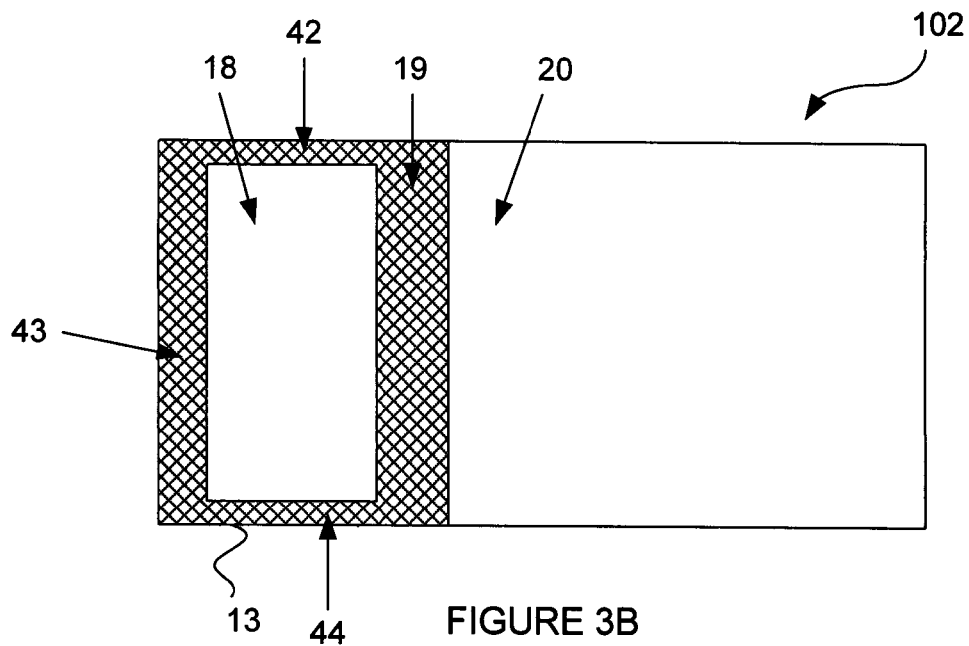
FIG. 3B is a top view of the multilayered structure of FIG. 3A.

FIG. 3B is a top view of the multilayered structure 102 of FIG. 3A. The first outer metal layer 11 and the first thin adhesion layer 12 can be patterned using standard semiconductor processes such as photolithography into one or more electrically isolated regions. As shown, the first outer metal layer 11 and the first thin adhesion layer 12 are patterned into two electrically isolated regions 18 and 20 forming a gap 19 and spaces 42, 43, and 44, which expose the diamond layer 13.

Figure 4:
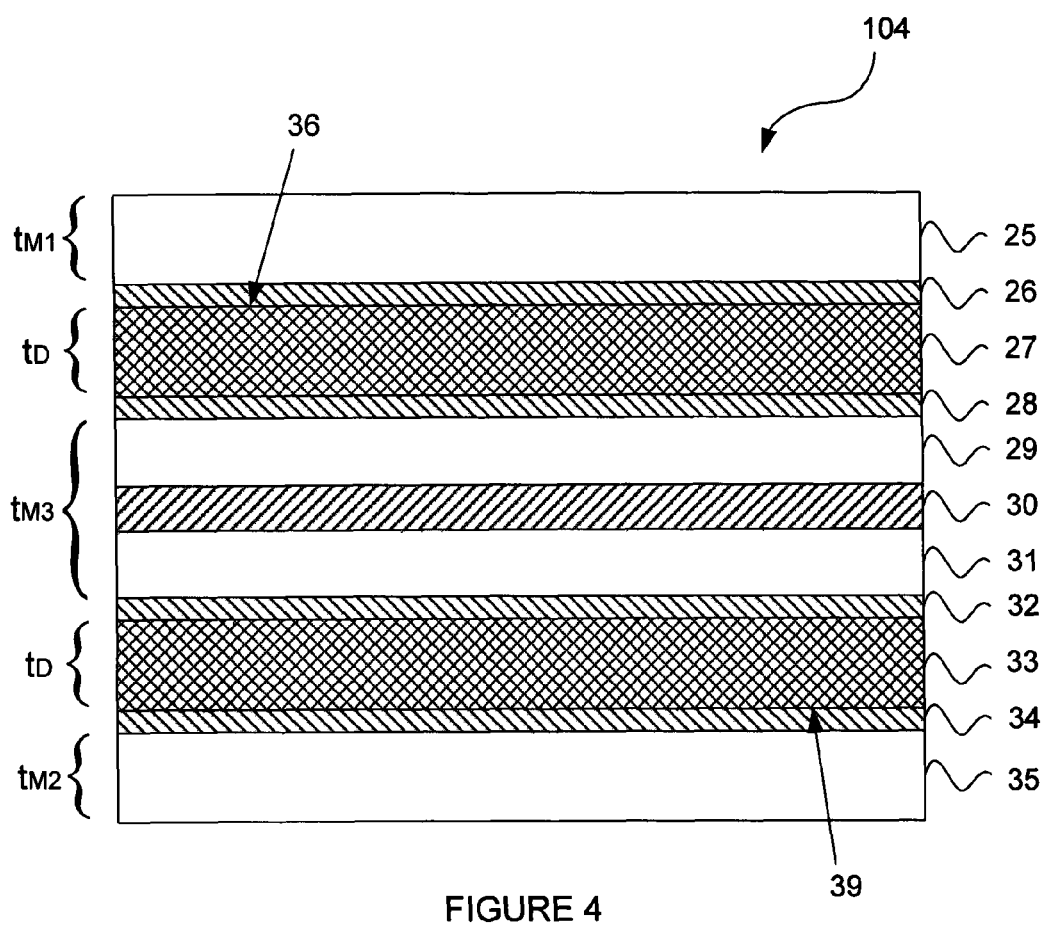
FIG. 4 is a cross-sectional view of the embodiment similar to that shown in FIG. 3A where the inner metal layer is composed of multiple inner metal layers.

FIG. 4 illustrates a cross-sectional view of an embodiment of a multilayered structure 104 that has a plurality of inner metal layers. As shown, the multilayered structure 104 includes a first inner metal layer 29 having a thermal conductivity greater than 200 W/m-K and a coefficient of thermal expansion greater than 12 ppm/K and a second inner metal layer 31 having a thermal conductivity greater than 200 W/m-K and a coefficient of thermal expansion greater than 12 ppm/K. A brazing alloy or solder alloy 30 having a thermal conductivity greater than 50 W/m-K and a coefficient of thermal expansion greater than 12 ppm/K is disposed between the first inner metal layer 29 and the second inner metal layer 31. A first inner thin adhesion layer 28 is disposed between a first diamond layer 27 and the first inner metal layer 29. A second inner thin adhesion layer 32 is disposed between a second diamond layer 33 and the second inner metal layer 31. A first outer thin adhesion layer 26 is deposited on the top surface 36 of the first diamond layer 27. A second outer thin adhesion layer 34 is deposited on the bottom surface 39 of the second diamond layer 33. A first outer metal layer 25 having a thermal conductivity greater than 200 W/m-K and a coefficient of thermal expansion greater than 12 ppm/K is deposited on the first outer thin adhesion layer 26 and a second outer metal layer 35 having a thermal conductivity greater than 200 W/m-K and a coefficient of thermal expansion greater than 12 ppm/K is deposited on the second outer thin adhesion layer 34.

The following CTE matching equation (2) can determine the thickness of the first and second diamond layers for the embodiments illustrated in FIG. 3A through FIG. 4:

$$t_D = t_{M1} \times (E_D/E_{M1}) \times ((CTE_{M1} - CTE_C)/(CTE_C - CTE_D)) + t_{M2} \times (E_D/E_{M2}) \times ((CTE_{M2} - CTE_C)/(CTE_C - CTE_D)),$$ where the variables:

$t_D$ = thickness of each of the first and second diamond layers
$t_{M1}$ = thickness of the first outer metal layer
$t_{M2}$ = thickness of the second outer metal layer
$E_D$ = Young's modulus of the first and second diamond layers
$E_{M1}$ = Young's modulus of the first outer metal layer
$E_{M2}$ = Young's modulus of the second outer metal layer
$CTE_D$ = coefficient of thermal expansion of each of the first and second diamond layers
$CTE_{M1}$ = coefficient of thermal expansion of the first outer metal layer
$CTE_{M2}$ = coefficient of thermal expansion of the second outer metal layer
$CTE_C$ = coefficient of thermal expansion for surface of the multilayered structure The thickness of the inner metal layer can be determined by the following equation $t_{M3} = t_{M1} + t_{M2}$ As long as $CTE_{M3}$ = coefficient of thermal expansion of the inner metal layer=average value of $CTE_{M1}$ and $CTE_{M2}$ and $E_{M3}$ = Young's modulus of the inner metal layer=the average value of $E_{M1}$ and $E_{M2}$ and each adhesion layer is relatively thin (less than 10%) compared to the thickness of each of the outer metal layers, the CTE matching equation (2) can determine the thickness of the diamond layers and the metal layers again using PC software such as Microsoft Excel Solver.

The thickness of each outer metal layer is determined by the thickness of the adjacent diamond layer and the properties of the diamond and metal layers such as Young's modulus and the CTE difference between the metal and diamond layers. The thickness of the inner metal layer is equal or greater than the sum of the two outer metal layers multiplied by the ratio of the CTE between the inner and outer metal layers. This multilayered structure provides a symmetrical expansion characteristic which will be compatible with semiconductors and allow a high thermal conductivity and a high reliability bond between the semiconductor device and the multilayered structure.

A multilayered structure can maintain symmetry and follow the CTE matching equation (2) with an inner metal layer that is not the same thickness as the sum of the outer metal layers as long as the thicknesses of the diamond layers are the same and the outer metal layers and the diamond layers form symmetrical structures.

Figure 5:
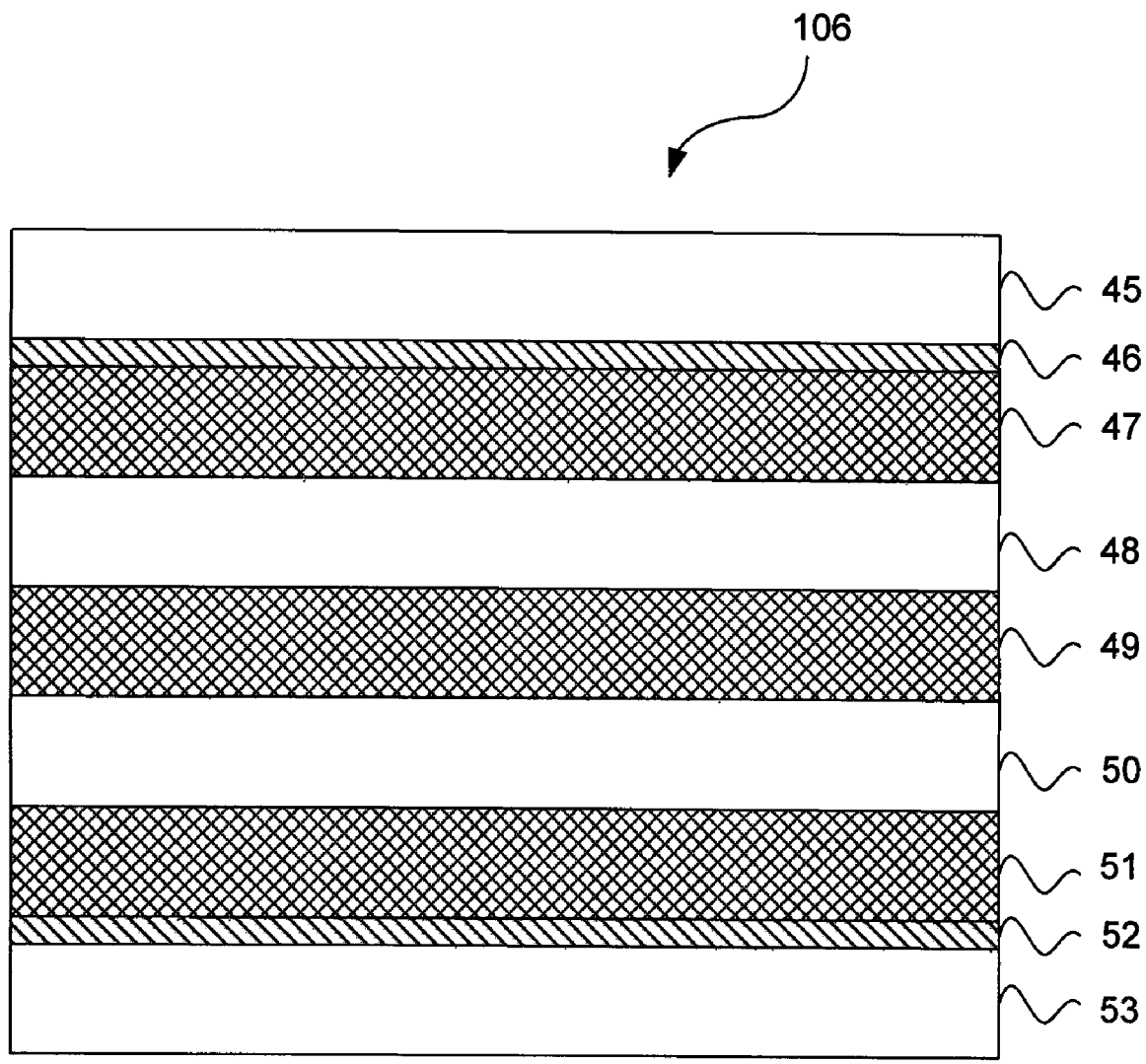
FIG. 5 is a cross-sectional view of a multilayered structure that has more than two diamond layers.

FIG. 5 illustrates a cross-sectional view of another embodiment of a multilayered structure 106 that has more than two diamond layers. The multilayered structure 106 includes a first inner metal layer 48 having a thermal conductivity greater than 200 W/m-K and a coefficient of thermal expansion greater than 12 ppm/K, a first diamond layer 47 bonded to the top surface of the first inner metal layer 48. The multilayered structure 106 also includes a second diamond layer 49 bonded to the bottom surface of the first inner metal layer 48. A second inner metal layer 50 having a thermal conductivity greater than 200 W/m-K and a coefficient of thermal expansion greater than 12 ppm/K is bonded to the bottom surface of the second diamond layer 49. A third diamond layer 51 is bonded to the bottom surface of the second inner metal layer 50. A first thin adhesion layer 46 is on the top surface of the first diamond layer 47. A second thin adhesion layer 52 is on the bottom surface of the third diamond layer 51. A first outer metal layer 45 having a thermal conductivity greater than 200 W/m-K and a coefficient of thermal expansion greater than 12 ppm/K is deposited on the first thin adhesion layer 46. A second outer metal layer 53 having a thermal conductivity greater than 200 W/m-K and a coefficient of thermal expansion greater than 12 ppm/K is deposited on the second thin adhesion layer 52.

Figure 6:
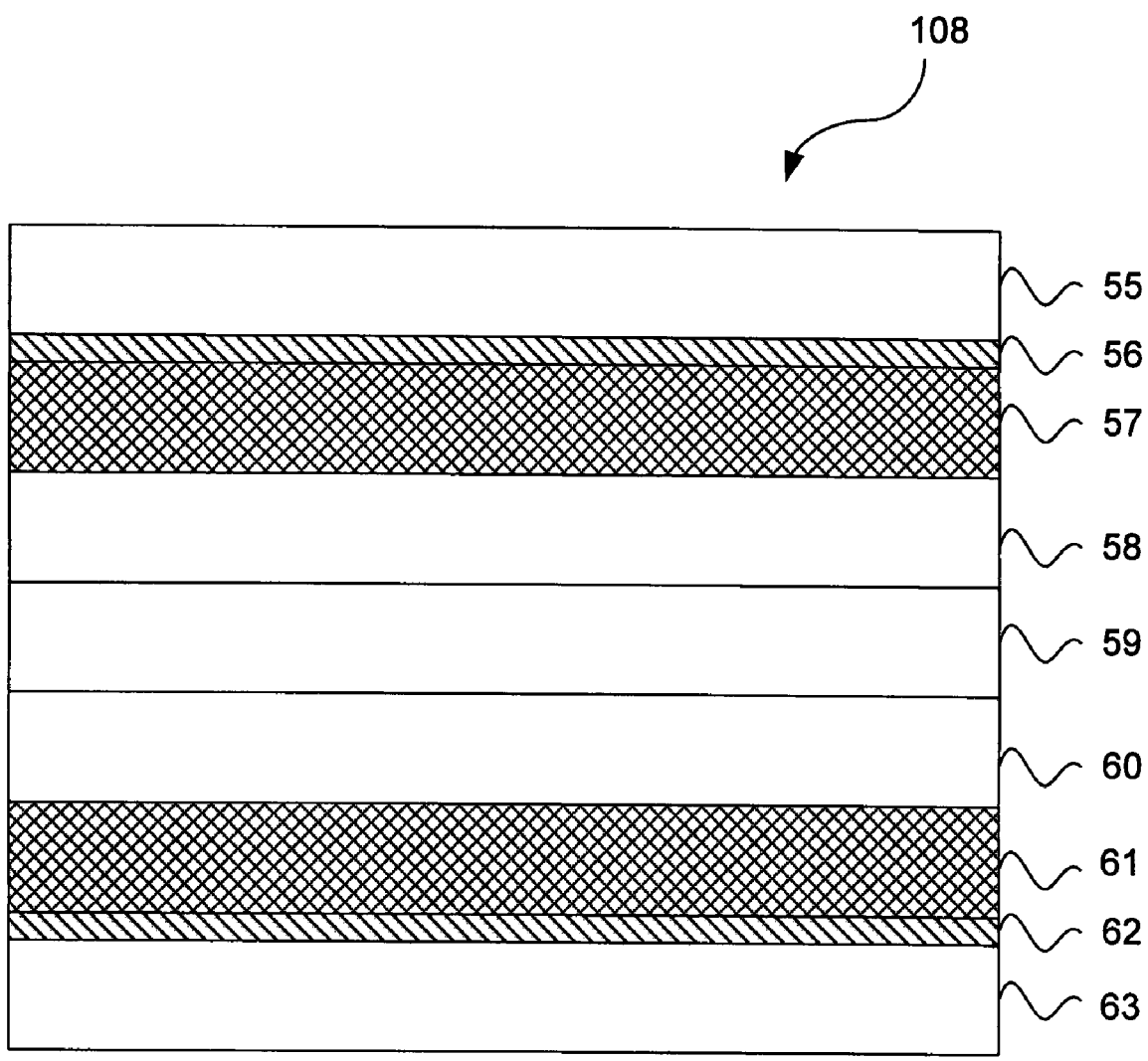
FIG. 6 is a cross-sectional view of a thicker multilayered structure that has multiple inner metal layers.

FIG. 6 illustrates a cross-sectional view of an embodiment of a thicker multilayered structure 108 that has multiple inner metal layers. The multilayered structure 108 includes a first inner metal layer 58 having a thermal conductivity greater than 200 W/m-K and a coefficient of thermal expansion greater than 12 ppm/K. A first diamond layer 57 is bonded to the top surface of the first inner metal layer 58. A second inner metal layer 59 having a thermal conductivity greater than 200 W/m-K and a coefficient of thermal expansion greater than 12 ppm/K is bonded to the bottom surface of the first inner metal layer 58. A third inner metal layer 60 having a thermal conductivity greater than 200 W/m-K and a coefficient of thermal expansion greater than 12 ppm/K is bonded to the bottom surface of the second inner metal layer 59. A second diamond layer 61 is bonded to the bottom surface of the third inner metal layer 60. A first thin adhesion layer 56 is on the top surface of the first diamond layer 57. A second thin adhesion layer 62 is on the bottom surface of the second diamond layer 61. A first outer metal layer 55 having a thermal conductivity greater than 200 W/m-K and a coefficient of thermal expansion greater than 12 ppm/K is deposited on the first thin adhesion layer 56. A second outer metal layer 63 having a thermal conductivity greater than 200 W/m-K and a coefficient of thermal expansion greater than 12 ppm/K is deposited on the second thin adhesion layer 62.

Figure 7:
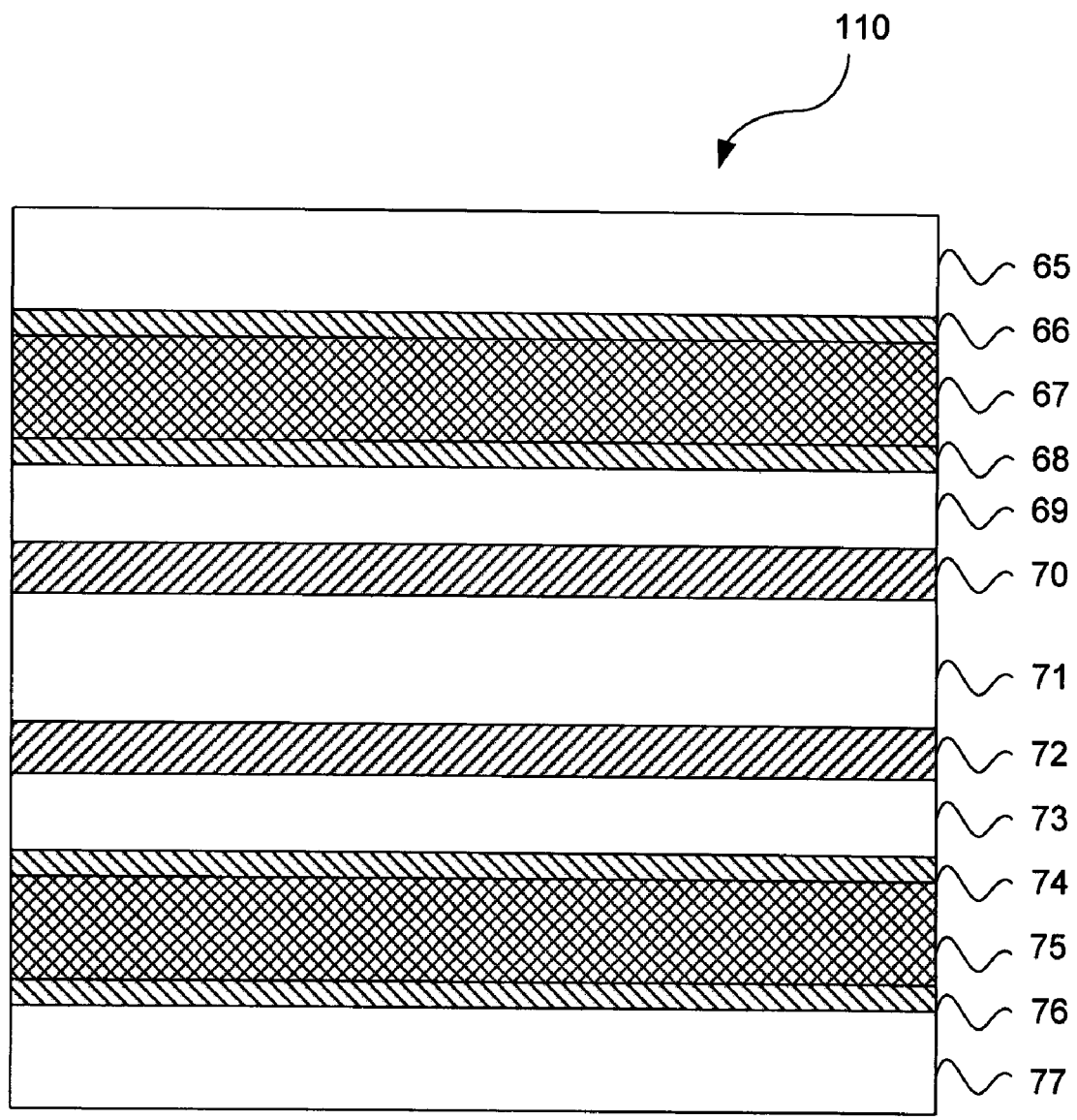
FIG. 7 is a cross-sectional view of a multilayered structure made of two structures as shown in FIG. 1 bonded together using metal alloys.

FIG. 7 is a cross-sectional view of a multilayered structure 110 made of two structures as shown in FIG. 1 bonded together using metal alloys. The multilayered structure 110 includes a first inner metal layer 69 having a thermal conductivity greater than 200 W/m-K and a coefficient of thermal expansion greater than 12 ppm/K and a second inner metal layer 71 having a thermal conductivity greater than 200 W/m-K and a coefficient of thermal expansion greater than 12 ppm/K. A first metal alloy 70 such as braze or a solder having a thermal conductivity greater than 50 W/m-K and a coefficient of thermal expansion greater than 12 ppm/K bonds the first inner metal layer 69 and second inner metal layer 71. The multilayered structure also includes a third inner metal layer 73 having a thermal conductivity greater than 200 W/m-K and a coefficient of thermal expansion greater than 12 ppm/K. A second metal alloy 72 such as braze or solder having a thermal conductivity greater than 50 W/m-K and a coefficient of thermal expansion greater than 12 ppm/K bonds the second inner metal layer 71 and the third inner metal layer 73. The multilayered structure also includes a first diamond layer 67 and a first inner thin adhesion layer 68 between the first diamond layer 67 and the first inner metal layer 69. The multilayered structure also includes a second diamond layer 75 and a second inner thin adhesion layer 74 between the second diamond layer 75 and the third inner metal layer 73. A first outer thin adhesion layer 66 is on the top surface of the first diamond layer 67 and a second outer thin adhesion layer 76 is on the bottom surface of the second diamond layer 75. A first outer metal layer 65 having a thermal conductivity greater than 200 W/m-K and a coefficient of thermal expansion greater than 12 ppm/K is deposited on the first outer thin adhesion layer 66. A second outer metal layer 77 having a thermal conductivity greater than 200 W/m-K and a coefficient of thermal expansion greater than 12 ppm/K, wherein the second outer metal layer 77 is deposited on the second outer thin adhesion layer 76.

Figure 8A:
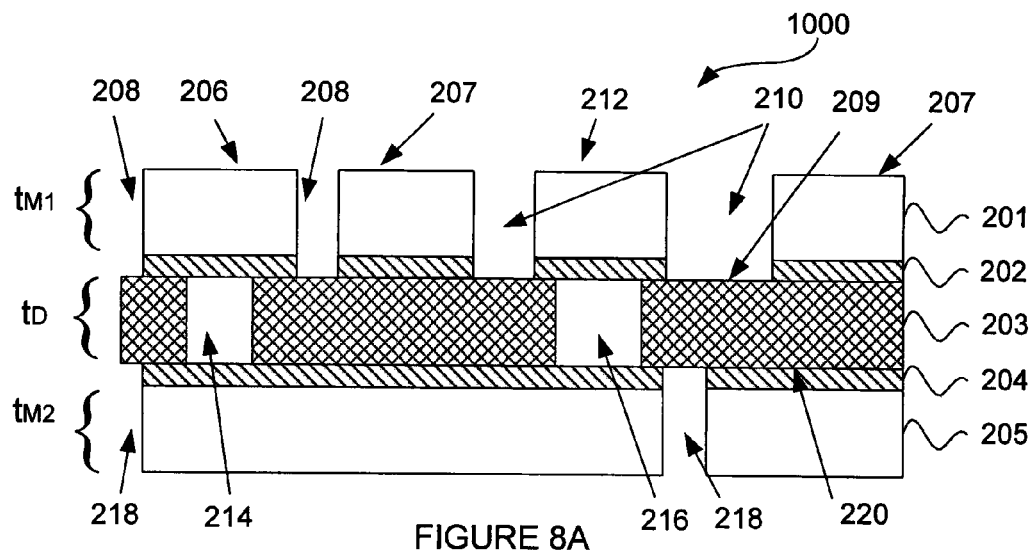
FIG. 8A is a cross-sectional view of an embodiment of a multilayered structure that has one diamond layer with a plurality of vias.

FIG. 8A illustrates a cross-sectional view of an embodiment of a multilayered structure 1000 that has a diamond layer 203. As shown, the diamond layer 203 has a top surface 209, a bottom surface 220, and metal filled vias 214, 216. A first thin adhesion layer 202 is disposed on the top surface 209 and a second thin adhesion layer 204 is on the bottom surface 220. A first metal layer 201 having a thermal conductivity greater than 200 W/m-K and a coefficient of thermal expansion greater than 12 ppm/K is deposited on the first thin adhesion layer 202. A second metal layer 205 having a thermal conductivity greater than 200 W/m-K and a coefficient of thermal expansion greater than 12 ppm/K is deposited on the second thin adhesion layer 204. As shown, the methods of example 9 result in spaces 208 and 210 in the first thin adhesion layer 202 and the first metal layer 201 and result in space 218 in the second thin adhesion layer 204 and the second metal layer 205

Figure 8B:
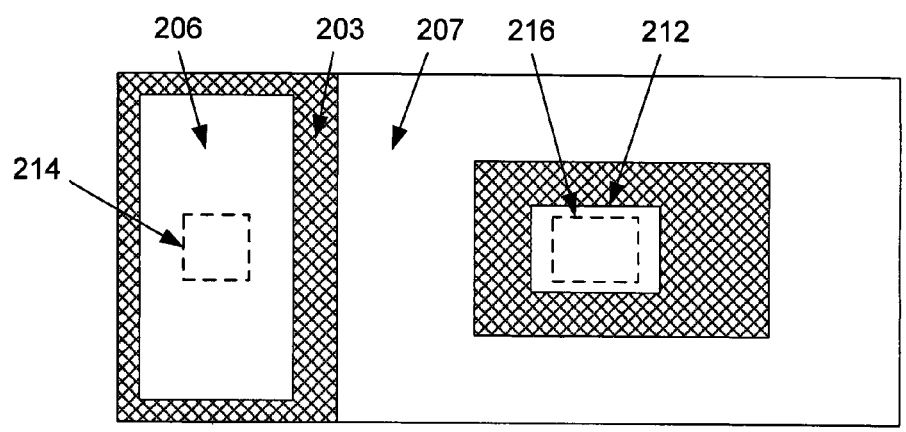
FIG. 8B is a top view of the multilayered structure of FIG. 8A.

FIG. 8B is a top view of the multilayered structure 1000 of FIG. 8A. As discussed in example 9 and shown in FIGS. 8A-8B, the first metal layer 201 and the first thin adhesion layer 202 can be patterned using semiconductor processes such as photolithography into one or more electrically isolated regions. As shown, the first metal layer 201 and the first thin adhesion layer 202 are patterned into electrically isolated regions 206, 207, and 212, forming spaces 208 and 210, which exposes the diamond layer 203. The dotted lines indicate metal filled vias 214, 216, which do not extend to the top of the multilayered structure 1000.

Figure 8C:
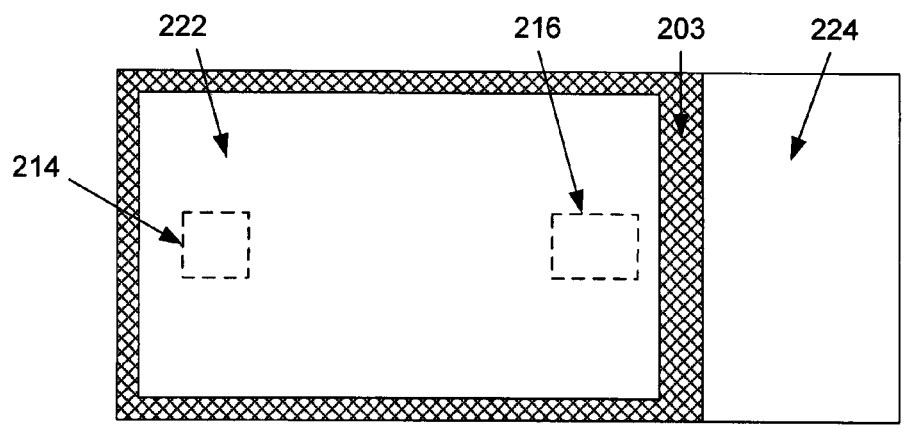
FIG. 8C is a bottom view of the multilayered structure of FIG. 8A.

FIG. 8C is a bottom view of the multilayered structure 1000 of FIG. 8A. As discussed in example 9 and shown in FIGS. 8A-8C, the second metal layer 205 and the second thin adhesion layer 204 can be patterned using semiconductor processes such as photolithography into one or more electrically isolated regions. As shown, the second metal layer 205 and the second thin adhesion layer 204 are patterned into electrically isolated regions 222 and 224 with a space 218 (FIG. 8A), which exposes the diamond layer 203. The dotted lines indicate the location of metal filled vias 214, 216 which do not extend to the bottom of the multilayered structure 1000.

The following CTE matching equation (3) can be used to determine the thickness of the diamond layer in the multilayered structure illustrated in FIGS. 8A-8C.

$$t_D = t_{M1} \times (E_D/E_{M1}) \times ((CTE_{M1} - CTE_D)/(CTE_C - CTE_D)) + t_{M2} \times (E_D/E_{M2}) \times ((CTE_{M2} - CTE_C)/(CTE_C - CTE_D)), \text{ where the variables:}$$

$t_D$ = thickness of the diamond layer
$t_{M1}$ = thickness of the first metal layer
$t_{M2}$ = thickness of the second metal layer
$E_D$ = Young's modulus of the diamond layer
$E_{M1}$ = Young's modulus of the first metal layer
$E_{M2}$ = Young's modulus of the second metal layer
$CTE_D$ = coefficient of thermal expansion of the diamond layer with one or more vias
$CTE_{M1}$ = coefficient of thermal expansion of the first metal layer that may include electrically isolated regions and dielectric material(s)
$CTE_{M2}$ = coefficient of thermal expansion of the second metal layer that may include electrically isolated regions and dielectric material(s)
$CTE_C$ = coefficient of thermal expansion of the surface of the multilayered structure.

The CTE matching equation (3) includes new definitions for the following coefficients:

$CTE_D$ = coefficient of thermal expansion of the diamond layer with one or more vias. In an embodiment when the surface area of the metal filled vias is relatively small (e.g., less than 10%), we compute $CTE_D$ as we did in matching equation (1). If the metal filled vias cannot be safely ignored, we can compute $CTE_D$ = [(metal coefficient×metal filled via surface area)+(diamond coefficient×diamond surface area)]/total surface area. Alternatively, we can compute $CTE_D$ by inserting the surfaces areas and coefficients in the rule of mixtures or Kerner's model for composites described in detail on page 17.

$CTE_{M1}$ = coefficient of thermal expansion of the first metal layer that may include electrically isolated regions and dielectric material(s). In an embodiment when the surface area of the dielectric material(s) is zero or relatively small (e.g., less than 10%), we compute $CTE_{M1}$ as we did in matching equation (1). If the dielectric material(s) cannot be safely ignored, we can compute $CTE_{M1}$ = [(first metal coefficient×first metal surface area)+(dielectric material(s) coefficient×dielectric material(s) surface area)]/total surface area. Alternatively, we can compute $CTE_{M1}$ by inserting the surfaces areas and coefficients in the rule of mixtures or Kerner's model for composites described in detail on page 17.

$CTE_{M2}$ = coefficient of thermal expansion of the second metal layer that may include electrically isolated regions and dielectric material(s). In an embodiment when the surface area of the dielectric material(s) is zero or relatively small (e.g., less than 10%), we compute $CTE_{M2}$ as we did in matching equation (1). If the dielectric material(s) cannot be safely ignored, we can compute $CTE_{M2}$ = [(second metal coefficient×second metal surface area)+(dielectric material(s) coefficient×dielectric material(s) surface area)]/total surface area. Alternatively, we can compute $CTE_{M2}$ by inserting the surfaces areas and coefficients in the rule of mixtures or Kerner's model for composites described in detail on page 17.

The CTE matching equation (3) can be executed in PC software such as Microsoft Excel Solver to determine the thickness of the metal and diamond layers as long as thin adhesion layers are used. For example, each adhesion layer is preferably relatively thin (less than 10%) compared to the thickness of each of the metal layers. A thin adhesion layer may be between 10-1000 nanometers, and preferably between 50-500 nanometers. Also see example 9 below.

The application of the Rule of Mixtures and the use of Kerner's model of composites can be accomplished using the methods and equations described in "Evaluation of Rule of Mixtures Predictions of Thermal Expansion in Powder Processed Ni—Al2O3 Composites"; H. A. Bruck, B. H. Rabin; Journal of the American Ceramic Society, Vol. 82, Issue 10, pp. 2927-2930, 1999 and "The effect of powder processing on the coefficient of thermal expansion of MoSi2—Si3N4 composites"; H. Choe *, T. Hsieh, J. Wolfenstine; Materials Science and Engineering A237 (1997) 250-255, which are incorporated by reference herein.

Figure 9A:
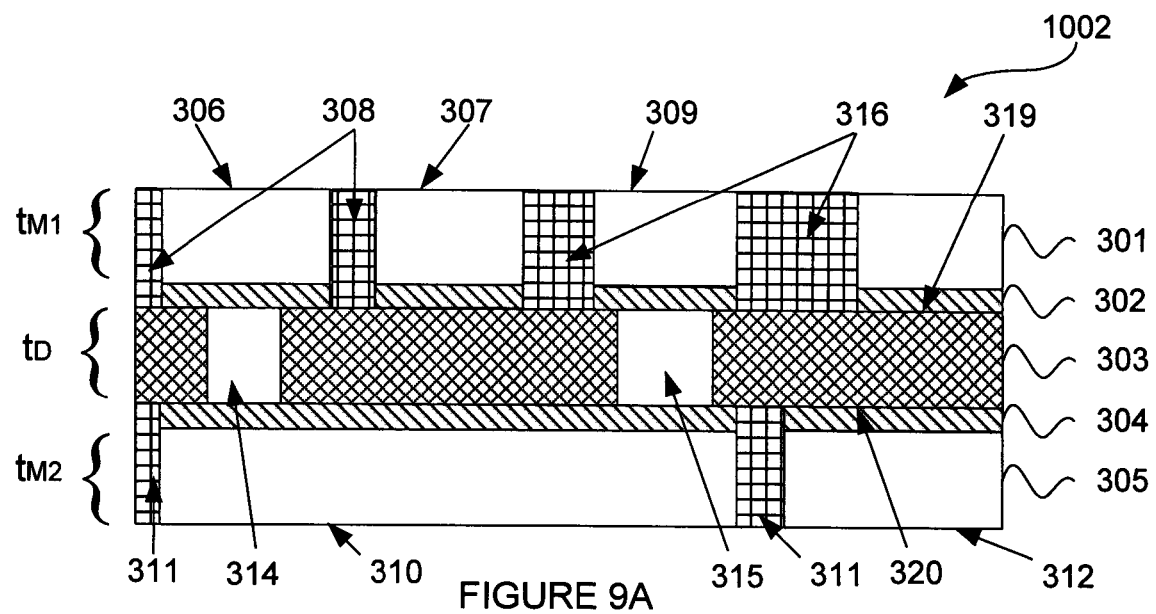
FIG. 9A is a cross-sectional view of an embodiment of the multilayered structure shown in FIG. 8A except dielectric material(s) fill the space between electrically isolated metallized regions on the upper and lower metal layers.

FIG. 9A is a cross-sectional view of an embodiment of the multilayered structure 1002 as shown in FIG. 8A except that dielectric material(s) fill some of the spaces. The multilayered structure 1002 has a diamond layer 303 having a top surface 319, a bottom surface 320, and metal filled vias 314, 315. A first thin adhesion layer 302 is disposed on the top surface 319 and a second thin adhesion layer 304 is on the bottom surface 320. A first metal layer 301 having a thermal conductivity greater than 200 W/m-K and a coefficient of thermal expansion greater than 12 ppm/K is deposited on the first thin adhesion layer 302. A second metal layer 305 having a thermal conductivity greater than 200 W/m-K and a coefficient of thermal expansion greater than 12 ppm/K is deposited on the second thin adhesion layer 304. As shown, the methods of example 10 result in dielectric material(s) 308, 316 between electrically isolated metallized regions 306, 307, and 309 of the first metal layer 301 and the first thin adhesion layer 302. Dielectric material(s) 311 fills the space between electrically isolated metallized regions 310, 312 (FIG. 9C) of the second metal layer 305 and the second thin adhesion layer 304.

Figure 9B:
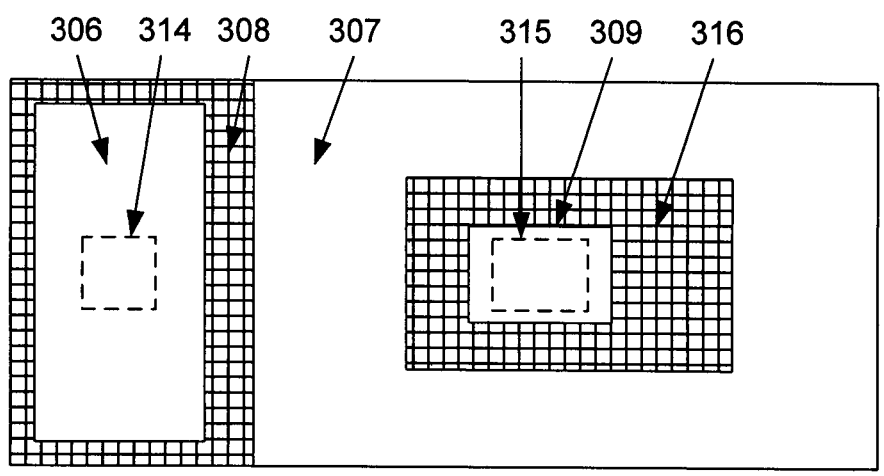
FIG. 9B is a top view of the multilayered structure of FIG. 9A.

FIG. 9B is a top view of the multilayered structure 1002 of FIG. 9A. As discussed in example 10 and shown in FIGS. 9A-9B, the first metal layer 301 and the first thin adhesion layer 302 can be patterned using semiconductor processes such as photolithography into one or more electrically isolated regions. As shown, the first metal layer 301 and the first thin adhesion layer 302 are patterned into electrically isolated regions 306, 307, and 309 and the dielectric material(s) 308 and 316 fill the space between the regions. The dotted lines indicate the location of metal filled vias 314, 315, which do not extend to the top of the multilayered structure 1002.

Figure 9C:
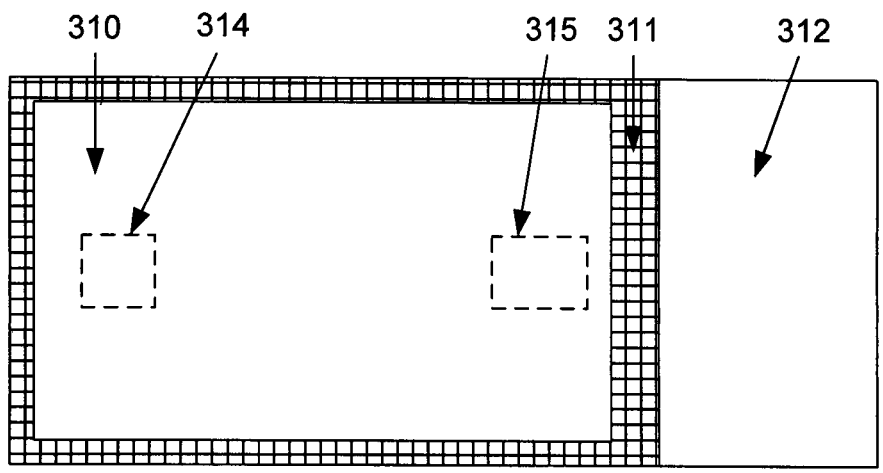
FIG. 9C is a bottom view of a multilayered structure of FIG. 9A

FIG. 9C is a bottom view of the multilayered structure 1002 of FIG. 9A. As discussed in example 10 and shown in FIGS. 9A and 9C, the second metal layer 305 and the second thin adhesion layer 304 can be patterned using semiconductor processes such as photolithography into one or more electrically isolated regions. As shown, the second metal layer 305 and the second thin adhesion layer 304 are patterned into electrically isolated regions 310 and 312 and dielectric material(s) 311 fills the space around region 310 and between the regions. The dotted lines indicate the location of metal filled vias 314, 315, which do not extend to the bottom of the multilayered structure 1002.

The CTE matching equation (3) can be used to determine the thickness of the various layers in the multilayered structure illustrated in FIG. 9A. The CTE matching equation (3) can be executed in PC software such as Microsoft Excel Solver to determine the thickness of the metal and diamond layers as long as thin adhesion layers are used. For example, each adhesion layer is preferably relatively thin (less than 10%) compared to the thickness of each of the outer metal layers. A thin adhesion layer may be between 10-1000 nanometers, and preferably between 50-500 nanometers.

Figure 10A:
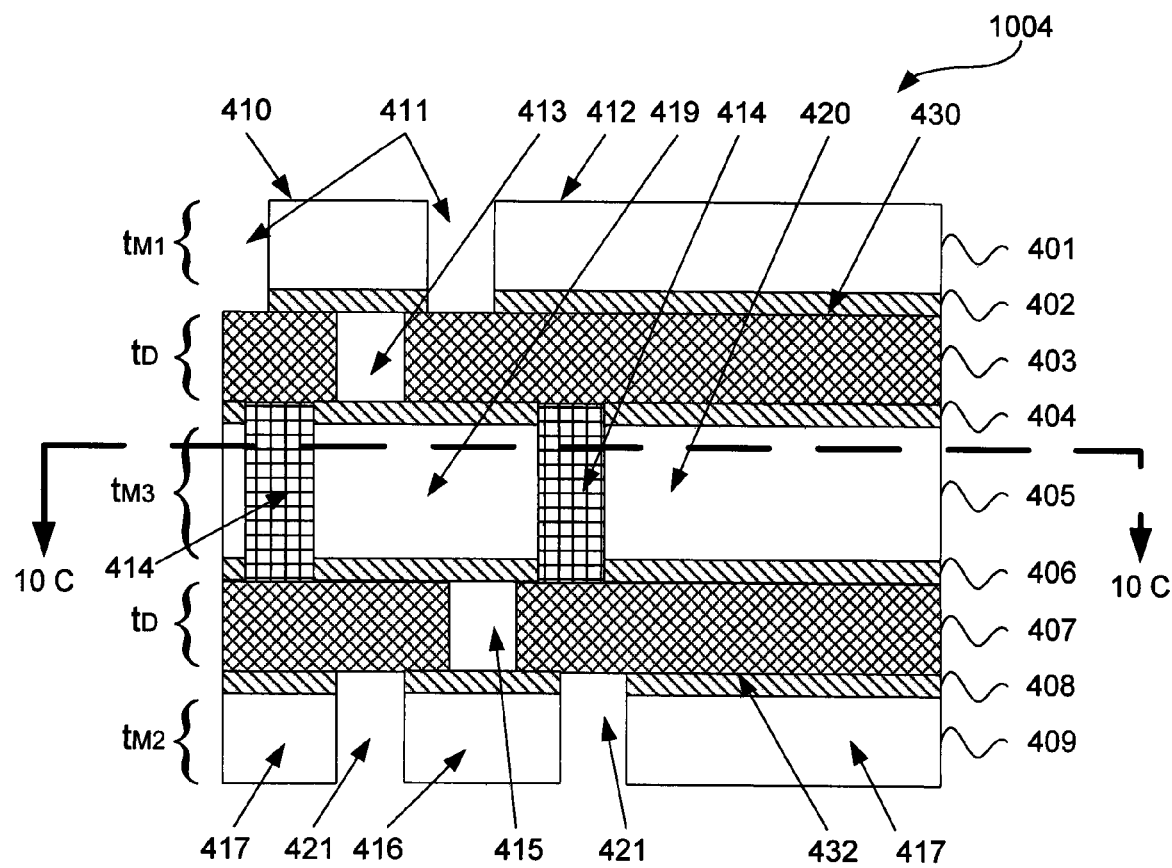
FIG. 10A is a cross-sectional view of an embodiment of the multilayered structure that has a patterned inner metal layer, wherein part of the patterned metal layer is connected to metal filled vias in the diamond layers.

FIG. 10A is a cross-sectional view of an embodiment of the multilayered structure 1004 that has two diamond layers. As shown, the multilayered structure 1004 includes an inner metal layer 405 having a thermal conductivity greater than 200 W/m-K and a coefficient of thermal expansion greater than 12 ppm/K. A first diamond layer 403 includes at least one metal filled via 413. A first inner thin adhesion layer 404 is disposed between the first diamond layer 403 and the inner metal layer 405. A second diamond layer 407 includes at least one metal filled via 415. A second inner thin adhesion layer 406 is disposed between the second diamond layer 407 and the inner metal layer 405. A first outer thin adhesion layer 402 is on the top surface 430 of the first diamond layer 403. A second outer thin adhesion layer 408 is on the bottom surface 432 of the second diamond layer 407. A first outer metal layer 401 has a thermal conductivity greater than 200 W/m-K and a coefficient of thermal expansion greater than 12 ppm/K, wherein the first outer metal layer 401 is deposited on the first outer thin adhesion layer 402. A second outer metal layer 409 has a thermal conductivity greater than 200 W/m-K and a coefficient of thermal expansion greater than 12 ppm/K, wherein the second outer metal layer 409 is deposited on the second outer thin adhesion layer 408.

Figure 10B:
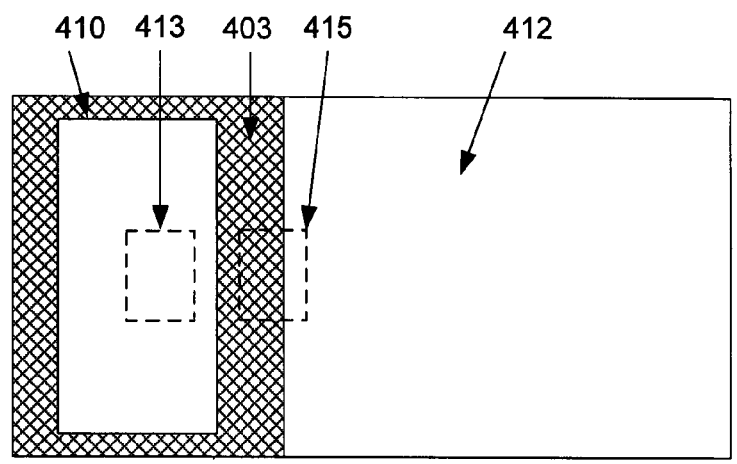
FIG. 10B is a top view of the multilayered structure of FIG. 10A.

As shown in FIGS. 10A-10B, the methods of example 11 result in space 411 around region 410 and between electrically isolated regions 410, 412 in the first outer thin adhesion layer 402 and the first outer metal layer 401. As shown in FIGS. 10A and 10D, the methods of example 11 also result in space 421 around region 416 and between electrically isolated regions 416, 417 in the second outer thin adhesion layer 408 and the second outer metal layer 409.

Figure 10C:
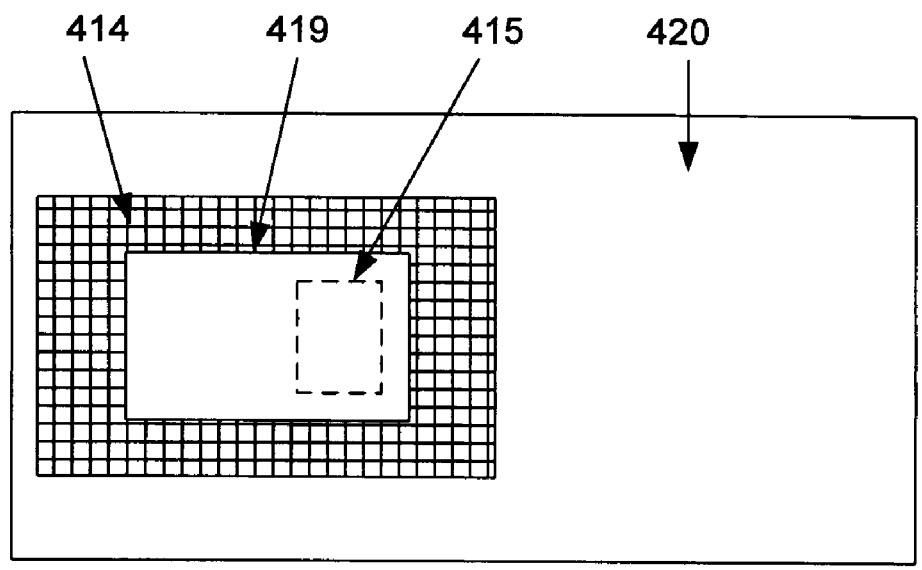
FIG. 10C is a sectional view downward from line C-C shown in the multilayered structure of FIG. 10A.
Figure 10D:
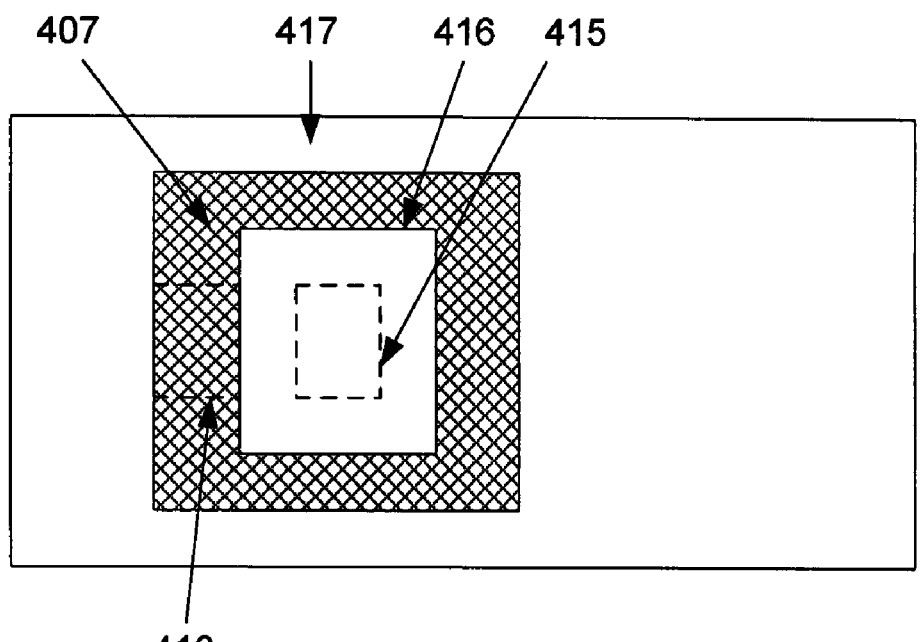
FIG. 10D is a bottom view of the multilayered structure of FIG. 10A.

As shown in FIGS. 10A and 10C, the methods of example 11 also result in inner metal layer 405 and the inner thin adhesion layers 404, 406 patterned into electrically isolated regions 419, 420, wherein one or more regions in the first and/or second outer metal layers 410, 416 are connected through metal filled vias 413, 415 in the diamond layers 403, 407, to at least one electrically isolated region 419 in the inner metal layer 405. A dielectric material(s) (e.g., diamond) 414 fills the space between electrically isolated metal regions 419, 420.

FIG. 10B is a top view of the multilayered structure 1004 of FIG. 10A. As discussed in example 11 and shown in FIGS. 10A-10B, the first outer metal layer 401 and the first outer thin adhesion layer 402 can be patterned using semiconductor processes such as photolithography into one or more electrically isolated regions. As shown, the first outer metal layer 401 and the first outer thin adhesion layer 402 are patterned into electrically isolated regions 410 and 412, which form a space 411, and expose the diamond layer 403. The dotted lines indicate the location of metal filled vias 413, 415, which do not extend to the top of the multilayered structure 1004.

FIG. 10C illustrates the multilayered structure 1004 with a sectional view downward from line 10C-10C as shown in FIG. 10A. As discussed in example 11 and shown in FIG. 10A and FIG. 10C, the inner metal layer 405 and the inner thin adhesion layers 404 and 406 can be patterned into electrically isolated regions 419 and 420 where dielectric material(s) (e.g. diamond) 414 fills the space surrounding region 419 and between the regions. The dotted line indicates the location of metal filled via 415 which doesn't extend to region 419.

FIG. 10D is a bottom view of the multilayered structure 1004 of FIG. 10A. As discussed in example 11 and shown in FIG. 10A and FIG. 10D, the second outer metal layer 409 and the second outer thin adhesion layer 408 can be patterned using semiconductor processes such as photolithography into one or more electrically isolated regions. As shown, the second outer metal layer 409 and the second outer thin adhesion layer 408 are patterned into electrically isolated regions 416 and 417 with a space 421, which surrounds region 416 and exposes diamond layer 407. The dotted lines indicate the location of metal filled vias 413 and 415, which do not extend to the bottom of the multilayered structure 1004.

The following CTE matching equation (4) can determine the thickness of the first and second diamond layers for the embodiments illustrated in FIG. 10A through FIG. 12:

$t_D = t_{M1} \times (E_D/E_{M1}) \times ((CTE_{M1} - CTE_C)/(CTE_C - CTE_D)) + t_{M2} \times (E_D/E_{M2}) \times ((CTE_{M2} - CTE_C)/(CTE_C - CTE_D))$, where the variables:

$t_D$ = thickness of each of the first and second diamond layers
$t_{M1}$ = thickness of the first outer metal layer
$t_{M2}$ = thickness of the second outer metal layer
$E_D$ = Young's modulus of the first and second diamond layers
$E_{M1}$ = Young's modulus of the first outer metal layer
$E_{M2}$ = Young's modulus of the second outer metal layer
$CTE_D$ = coefficient of thermal expansion of each of the first and second diamond layers with one or more vias
$CTE_{M1}$ = coefficient of thermal expansion of the first outer metal layer that may include electrically isolated regions and dielectric material(s)
$CTE_{M2}$ = coefficient of thermal expansion of the second outer metal layer that may include electrically isolated regions and dielectric material(s)
$CTE_C$ = coefficient of thermal expansion for surface of the multilayered structure The thickness of the inner metal layer can be determined by the following equation $t_{M3} = t_{M1} + t_{M2}$.

The CTE matching equation (4) includes new definitions for the following coefficients:

$CTE_D$ = coefficient of thermal expansion of the first and second diamond layer with one or more vias. In an embodiment, if the surface area of the metal filled vias is relatively small (e.g., less than 10%), we compute $CTE_D$ as we did in matching equation (1). If the metal filled vias cannot be safely ignored, we can compute $CTE_D$ = [(metal coefficient×metal filled via surface area)+(diamond coefficient×diamond surface area)]/total surface area. Alternatively, we can compute $CTE_D$ by inserting the surfaces areas and coefficients in the rule of mixtures or Kerner's model for composites.

$CTE_{M1}$ = coefficient of thermal expansion of the first metal layer that may include electrically isolated regions and dielectric material(s). In an embodiment when the surface area of the dielectric material(s) is zero or relatively small (e.g., less than 10%), we compute $CTE_{M1}$ as we did in matching equation (1). If the dielectric material(s) cannot be safely ignored, we can compute $CTE_{M1}$ = [(first metal coefficient× first metal surface area)+(dielectric material(s) coefficient× dielectric material(s) surface area)]/total surface area. Alternatively, we can compute $CTE_{M1}$ by inserting the surfaces areas and coefficients in the rule of mixtures or Kerner's model for composites.

$CTE_{M2}$ = coefficient of thermal expansion of the second metal layer that may include electrically isolated regions and dielectric material(s). In an embodiment when the surface area of the dielectric material(s) is zero or relatively small (e.g., less than 10%), we compute $CTE_{M2}$ as we did in matching equation (1). If the dielectric material(s) cannot be safely ignored, we can compute $CTE_{M2}$ = [(second metal coefficient×second metal surface area)+(dielectric material(s) coefficient×dielectric material(s) surface area)]/total surface area. Alternatively, we can compute $CTE_{M2}$ by inserting the surfaces areas and coefficients in the rule of mixtures or Kerner's model for composites.

As long as $CTE_{M3}$ = coefficient of thermal expansion of the inner metal layer = average value of $CTE_{M1}$ and $CTE_{M2}$ and $E_{M3}$ = Young's modulus of the inner metal layer = the average value of $E_{M1}$ and $E_{M2}$ and each adhesion layer is relatively thin (less than 10%) compared to the thickness of each of the outer metal layers, the CTE matching equation (4) can determine the thickness of the diamond layers and the metal layers using PC software such as Microsoft Excel Solver.

The thickness of each outer metal layer is determined by the thickness of the adjacent diamond layer and the properties of the diamond and metal layers such as Young's modulus and the CTE difference between the metal and diamond layers. The thickness of the inner metal layer is equal or greater than the sum of the two outer metal layers multiplied by the ratio of the CTE between the inner and outer metal layers. This multilayered structure provides a symmetrical expansion characteristic which will be compatible with semiconductors and allow a high thermal conductivity and a high reliability bond between the semiconductor device and the multilayered structure.

A multilayered structure can maintain symmetry and follow the CTE matching equation (4) with an inner metal layer that is not the same thickness as the sum of the outer metal layers as long as the thicknesses of the diamond layers are the same and the outer metal layers and the diamond layers form symmetrical structures.

The CTE matching equation (4) described above can be used to determine the thickness of the diamond layers in the multilayered structure illustrated in FIG. 10A. The CTE matching equation (4) can be executed in PC software such as Microsoft Excel Solver to determine the thickness of the metal and diamond layers as long as thin adhesion layers are used. For example, each adhesion layer is preferably relatively thin (less than 10%) compared to the thickness of each of the outer metal layers. A thin adhesion layer may be between 10-1000 nanometers, and preferably between 50-500 nanometers. Also see example 11 below.

In an embodiment, the CTE matching equation (4) determines the thickness of the first diamond layer 403, the first outer metal layer 401, the inner metal layer 405, the second diamond layer 407, and the second outer metal layer 409. In an embodiment, the thickness of each of the first and second inner thin adhesion layers 404, 406, is less than 10% compared to the thickness of inner metal layer 405, and the thickness of each of the first and second outer thin adhesion layers 402, 408, is less than 10% compared to thickness of each of the first and second outer metal layers 401, 409.

Figure 11A:
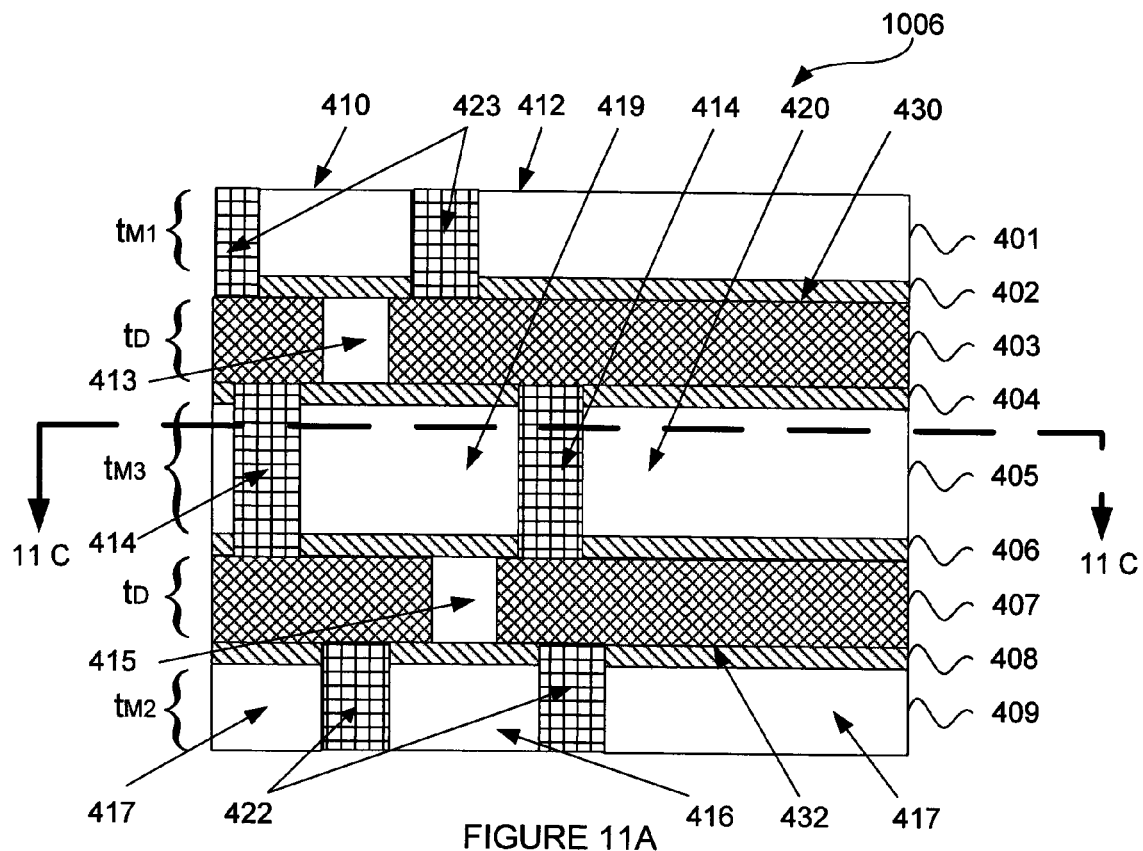
FIG. 11A is a cross-sectional view of an embodiment of the multilayered structure shown in FIG. 10A except dielectric material(s) fill the space between electrically isolated metallized regions on the upper and lower metal layers.

FIG. 11A is a cross-sectional view of an embodiment of the multilayered structure 1006 which is identical to multilayered structure 1004 shown in FIG. 10A except that dielectric material(s) 423 fills the space 411 (FIG. 10A) around electrically isolated metallized regions 410 and 412, and dielectric material(s) 422 fills the space 421 (FIG. 10A) around electrically isolated metallized regions 416 and 417 as discussed in example 12.

Figure 11B:
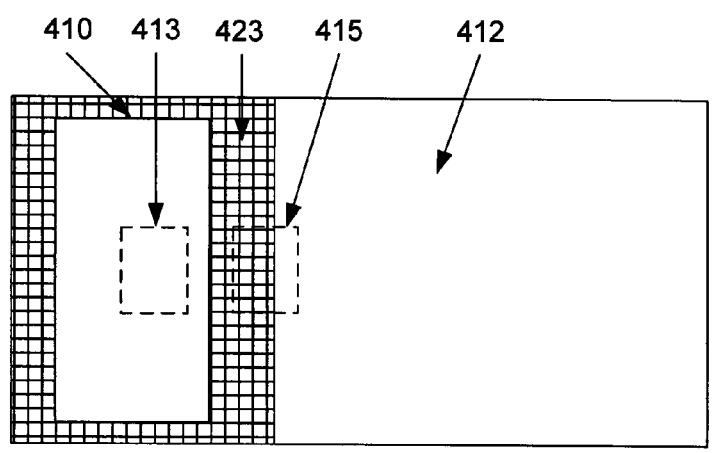
FIG. 11B is a top view of the multilayered structure of FIG. 11A.

FIG. 11B is a top view of the multilayered structure 1006 of FIG. 11A. As discussed in example 12 and shown in FIGS. 11A-11B, the first outer metal layer 401 and the first outer thin adhesion layer 402 can be patterned using semiconductor processes such as photolithography into one or more electrically isolated regions where dielectric material(s) fill the space between the isolated metal regions. As shown, the first outer metal layer 401 and the first outer thin adhesion layer 402 are patterned into electrically isolated regions 410 and 412, forming at least one space 411 (FIG. 10A) which is filled with dielectric material(s) 423. The dotted line indicates the location of metal filled vias 413, 415, which do not extend to the top of the multilayered structure 1006.

Figure 11C:
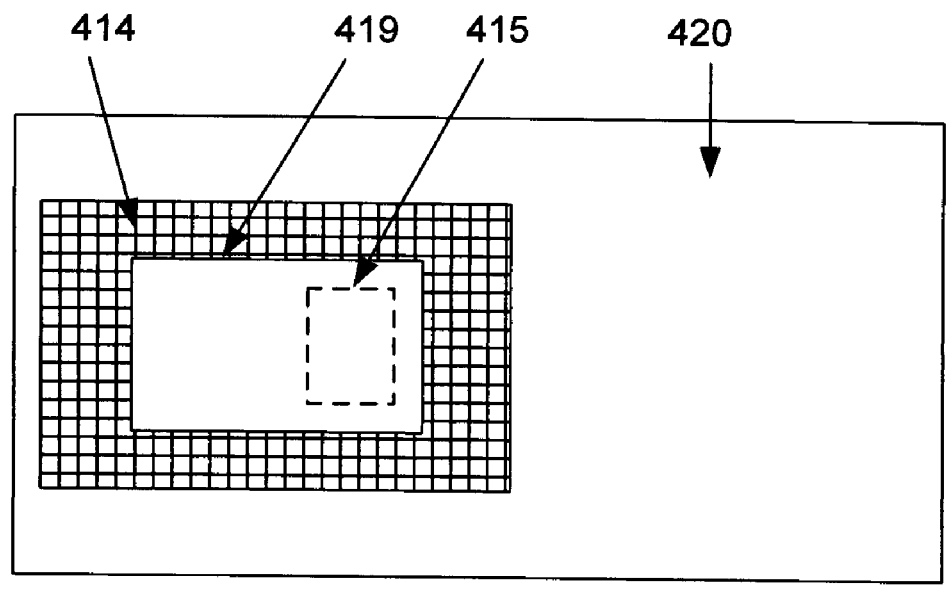
FIG. 11C is a sectional view downward from line C-C of the multilayered structure shown in FIG. 11A.

FIG. 11C illustrates the multilayered structure 1006 with a sectional view downward from line 11C-11C as shown in FIG. 11A. As discussed in example 12 and shown in FIG. 11A and FIG. 11C, the inner metal layer 405 and the first and second inner thin adhesion layers 404 and 406 can be patterned into electrically isolated regions 419 and 420 where dielectric material(s) (e.g. diamond) 414 fills the space between the regions. The dotted line indicates the location of metal filled via 415, which does not extend to the region 419.

Figure 11D:
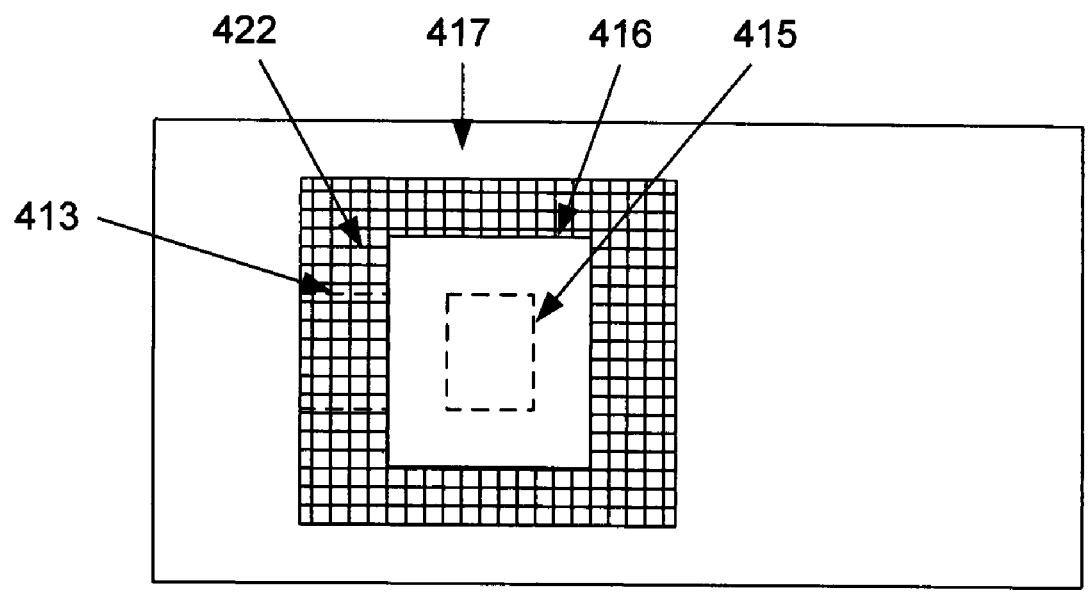
FIG. 11D is a bottom view of the multilayered structure of FIG. 11A.

FIG. 11D is a bottom view of the multilayered structure 1006 of FIG. 11A. As discussed in example 12 and shown in FIG. 11A and FIG. 11D, the second outer metal layer 409 and the second outer thin adhesion layer 408 can be patterned using semiconductor processes such as photolithography into one or more electrically isolated regions where dielectric material(s) fill the space between the isolated metal regions. As shown, the second outer metal layer 409 and the second outer thin adhesion layer 408 are patterned into electrically isolated regions 416 and 417, forming at least one space 421 (FIG. 10A) which is filled with dielectric material(s) 422. The dotted lines indicate the location of metal filled vias 413 and 415, which do not extend to the bottom of the multilayered structure 1006.

The CTE matching equation (4) described above can be used to determine the thickness of the diamond layers in the multilayered structure illustrated in FIG. 11A. The CTE matching equation (4) can be executed in PC software such as Microsoft Excel Solver to determine the thickness of the metal and diamond layers as long as thin adhesion layers are used. For example, each adhesion layer is preferably relatively thin (less than 10%) compared to the thickness of each of the outer metal layers. A thin adhesion layer may be between 10-1000 nanometers, and preferably between 50-500 nanometers. Also see examples 11-12 below.

Figure 12:
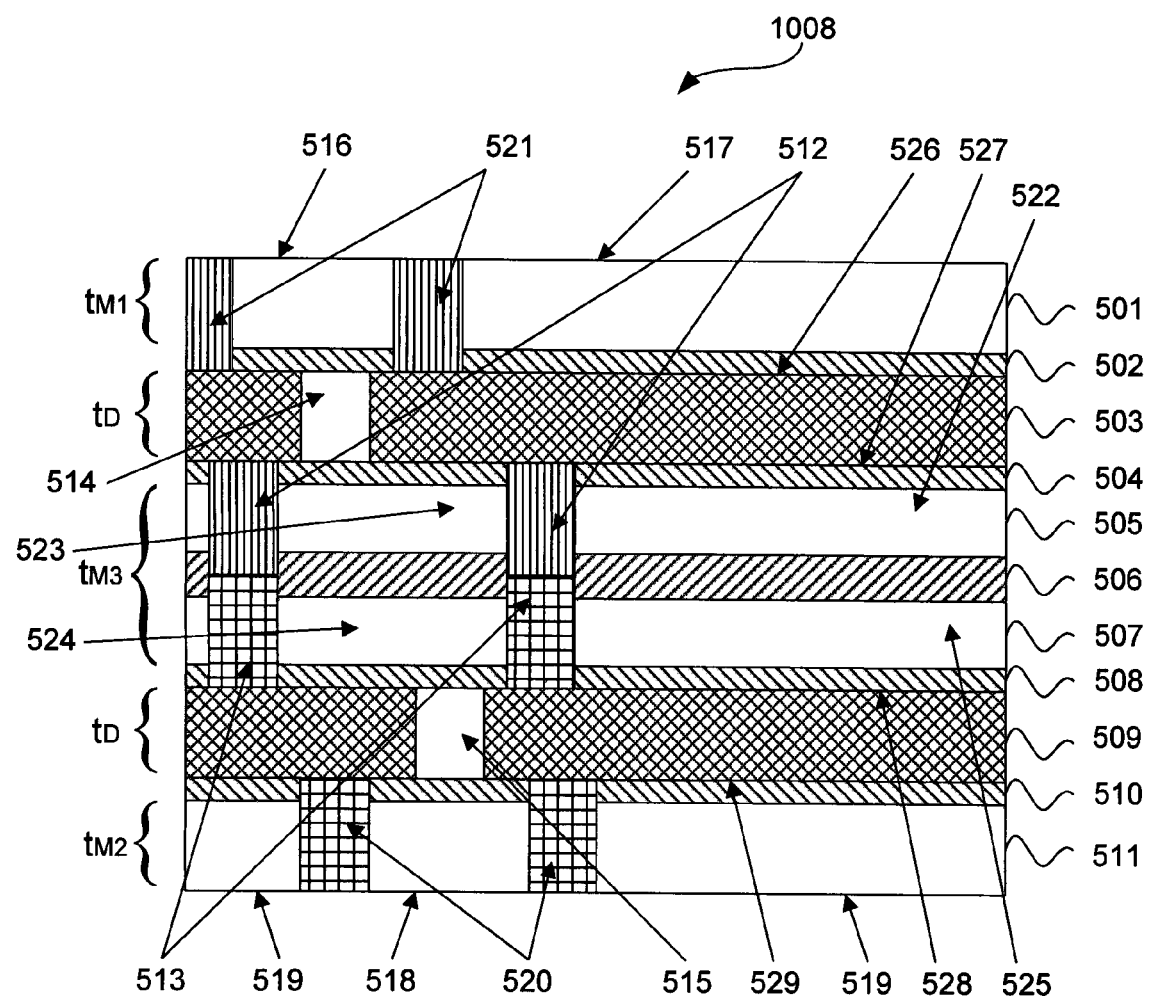
FIG. 12 is a cross-sectional view of a multilayered structure made of two structures as shown in FIGS. 8A-8C bonded together using metal alloys.

FIG. 12 is a cross-sectional view of a multilayered structure 1008 made of two multilayered structures 1000 as shown in FIGS. 9A-9C which are bonded together using metal alloys.

The multilayered structure 1008 includes a first diamond layer 503 having a top surface 526, a bottom surface 527, and at least one metal filled via 514. A first outer thin adhesion layer 502 is disposed on the top surface 526 and a first inner thin adhesion layer 504 is on the bottom surface 527. A first outer metal layer 501 having a thermal conductivity greater than 200 W/m-K and a coefficient of thermal expansion greater than 12 ppm/K is deposited on the first outer thin adhesion layer 502. A first inner metal layer 505 having a thermal conductivity greater than 200 W/m-K and a coefficient of thermal expansion greater than 12 ppm/K is deposited on the first inner thin adhesion layer 504. The methods of example 10 result in dielectric material(s) 521 between electrically isolated metallized regions 516 and 517 of the first outer metal layer 501 and the first outer thin adhesion layer 502. Dielectric material(s) 512 fills the space between electrically isolated metallized regions 522 and 523 of the first inner metal layer 505 and the first inner thin adhesion layer 504.

The multilayered structure 1008 also includes a second diamond layer 509 having a top surface 528, a bottom surface 529, and at least one metal filled via 515. A second inner thin adhesion layer 508 is disposed on the top surface 528 and a second outer thin adhesion layer 510 is on the bottom surface 529. A second inner metal layer 507 having a thermal conductivity greater than 200 W/m-K and a coefficient of thermal expansion greater than 12 ppm/K is deposited on the second inner thin adhesion layer 508. A second outer metal layer 511 having a thermal conductivity greater than 200 W/m-K and a coefficient of thermal expansion greater than 12 ppm/K is deposited on the second outer thin adhesion layer 510. The methods of example 10 will result in dielectric material(s) 513 between electrically isolated metallized regions 524 and 525 of the second inner metal layer 507 and the second inner thin adhesion layer 508. Dielectric material(s) 520 fills the space between electrically isolated metallized regions 518 and 519 of the second outer metal layer 511 and the second outer thin adhesion layer 510.

A metal alloy 506 such as braze or solder having a thermal conductivity greater than 50 W/m-K and a coefficient of thermal expansion greater than 12 ppm/K bonds first inner metal layer 505 to second inner metal layer 507. The following examples 1-12 describe further details on how to make the multilayered structures illustrated in FIG. 1A-1B and FIG. 3A-FIG. 12.

In addition, we incorporate by reference U.S. Pat. No. 5,833,753 to Herlinger et al., Reactor Having an Array of Heating Filaments and a Filament Force Regulator that describes a suitable reactor for growing chemical vapor deposition (CVD) diamond, and U.S. Pat. No. 6,319,610 B1 to Zimmer, Graded Grain Size Diamond Layer that describes suitable methods of depositing CVD diamond layers. We also incorporate by reference herein: Nishi and Doering, Handbook of Semiconductor Manufacturing Technology (2000) that describes suitable semiconductor processes, techniques, and equipment for making the multilayered structures described in the application. Nishi and Doering's table of contents lists semiconductor processes that are suitable to make the multilayered structures. For example, chapter 11 describes chemical vapor deposition (CVD), chapter 14—physical vapor deposition (PVD), chapter 15—chemical mechanical polishing (CMP), chapter 16—optical lithography, which we refer to as photolithography, and chapter 17—photoresist processing. In addition, the end of each chapter includes literature that is incorporated by reference herein. After review of the specification, the drawings, and incorporated literature, one of ordinary skill has sufficient information to make and use the multilayered structures of the present application.

EXAMPLE 1

The embodiment of the multilayered structure illustrated in FIGS. 1A-1B can be made by growing CVD diamond layer 3 on a silicon wafer (not shown) using hot filament or any similar diamond deposition technology.

The resulting diamond coated silicon wafer can be coated using conventional sputtering or other physical vapor deposition (PVD) technology on the diamond side with a thin adhesion layer 4 such as NiCr, TiW, or Cr followed by a seed layer of copper (Cu). The seed layer can be then plated with Cu, Ag, or a combination to form the metal layer 5 to a desired thickness using the CTE matching equation (1) to match a semiconductor device or an electronic component (not shown) to be mounted on the metal layer 1. The silicon wafer is removed by grinding, polishing, and or etching techniques.

The resulting structure of the diamond layer 3, the thin adhesion layer 4, and the metal layer 5 can be coated on the diamond side with the thin adhesion layer 2 such as NiCr, TiW, or Cr followed by a seed layer of copper (Cu) using sputtering or other PVD technology. The seed layer can be then plated with Cu, Ag, or a combination to form the metal layer 1 to a desired thickness using the CTE matching equation (1) to match an electronic component to be mounted on it.

The first metal layer 1 and second metal layer 5 can be further plated with Ni, Au, Pd, Pt or any other metals which are compatible with standard device attachment solders such as AuSn. In addition, the AuSn solder layer can also be applied at this time either by plating or PVD techniques.

After the further plating the multilayered structure can be divided into smaller pieces (i.e., segmenting) using laser and/or etching techniques to create individual multilayered structures which are electrically isolated between the two outer conductive surfaces by the intervening electrically insulating diamond layers.

The method of making the multilayered structure can optionally include a photomasking step to make electrically isolated metallized regions 6 and 7 as shown in FIG. 1B. The photomasking step can be implemented either before or after the plating step used to make metal layer 1. If before the plating step, the photomask prevents plating in space 8 shown in FIGS. 1A-1B. If after the plating step, the photomask protects electrically isolated metallized regions 6 and 7 during an etch step that removes metal layer 1 in isolation space 8. In either case an etching step is used to remove the thin adhesion layer 2 after metal layer 1 has been patterned. Additionally, a second photomasking step can be used to protect either region 6 or 7 for selective deposition of additional metal layers. For example, the region 6 can be masked and an AuSn solder and/or barrier metal layers deposited on the region 7.

EXAMPLE 2

The embodiment of the multilayered structure illustrated in FIGS. 3A-3B can be made by growing CVD diamond as described in Example 1. In this embodiment, the diamond layer 13 is grown on a silicon wafer (not shown) and the diamond layer 15 is grown on another silicon wafer (not shown). The silicon wafers can be then attached to each other by vacuum brazing the two diamond layers 13 and 15 together using inner metal layer 14 such as a braze foil consisting of Cu, Ag, and a reactive carbide forming component such as titanium or zirconium. An example of the braze foil is a reactive braze such as Wesgo CuSil ABA made by Wesgo, Hayward, Calif. During the vacuum brazing, a weight can be placed on the silicon wafers to apply a pressure (e.g., 1-2 psi) to ensure the diamond coated surfaces of the silicon wafers contact the braze at the melting point of the braze (e.g., 800-900 C). Grinding, polishing, and or etching techniques then remove the silicon wafers. As a result, the diamond layer 13, the inner metal layer 14, and the diamond layer 15 form a free standing substrate.

Next, a first thin adhesion layer 12 coats the diamond layer 13 and a second thin adhesion layer 16 coats diamond layer 15. The thin adhesion layers 12 and 16 can be NiCr, TiW, or Cr followed by a seed layer of copper (Cu) as described in Example 1. After coating, the seed layers can be plated to form the outer metal layers 11 and 17 as described in Example 1 with Cu, Ag, or a combination to the desired thickness using CTE matching equation (2). Additional plating, patterning, and segmenting can be implemented as described in Example 1.

EXAMPLE 3

The embodiment of the multilayered structure illustrated in FIG. 4 is made by bonding two structures made according to the techniques of Example 1. In FIG. 4, layer 30 bonds the two structures (e.g., layers 25-29 and 31-35). The layer 30 can be a braze alloy as described in Example 2 or a suitable solder alloy such as AuSn. The soldering can be done by applying pressure (e.g., 1-2 psi) to the two structures and heating to a temperature (e.g., 300 C) above the melting point of the AuSn solder for a time sufficient to bond and diffusing the solder into the two structures so that the melting point of the solder is raised above the initial melting point. Additional plating, patterning, and segmenting can be implemented as described in Example 1.

EXAMPLE 4

The embodiment of the multilayered structure illustrated in FIG. 5 can be made by growing CVD diamond layers as described in Example 1. In this embodiment, the diamond layer 47, 49, and 51 are each grown on a silicon wafer (not shown). Two silicon wafers can be then attached to each other by vacuum brazing diamond layers 47 and 49 together using a first inner metal layer 48 such as a braze foil consisting of Cu, Ag, and a reactive carbide forming component such as titanium or zirconium. During the vacuum brazing, a weight can be placed on the silicon wafers to apply a pressure (e.g., 1-2 psi) to ensure the diamond coated surfaces of the silicon wafers contact the braze at the melting point of the braze (e.g., 800-900 C). Grinding, polishing, and or etching techniques then remove the silicon wafers. As a result, the diamond layer 47, the first inner metal layer 48, and the diamond layer 49 form a free standing substrate. A second inner metal layer 50 bonds the resulting free standing substrate (layers 47-49) to the diamond layer 51 using the brazing technique described above.

Next, a first thin adhesion layer 46 coats the diamond layer 47 and a second thin adhesion layer 52 coats diamond layer 51. The thin adhesion layers 46 and 52 can be NiCr, TiW, or Cr followed by a seed layer of copper (Cu) as described in Example 1. After coating, the seed layer can be plated to form the outer metal layers 45 and 53 as described in Example 1 with Cu, Ag, or a combination to the desired thickness using CTE matching equation (2). Additional plating, patterning, and segmenting can be implemented as described in Example 1.

EXAMPLE 5

The embodiment of the multilayered structure illustrated in FIG. 6 can be made by growing CVD diamond layers as described in Example 1. In this embodiment, the diamond layer 57 and 61 are each grown on a silicon wafer (not shown). The two silicon wafers can be then attached to each other by vacuum brazing diamond layers 57 and 61 together using a first inner metal layer 58, such as a braze foil consisting of Cu, Ag, and a reactive carbide forming component such as titanium or zirconium, a second inner metal layer 59 such as copper foil, and an third inner metal layer 60, such as a braze foil consisting of Cu, Ag, and a reactive carbide forming component such as titanium or zirconium. The three inner metal layers permit a thicker and more rigid structure because the diamond layers are spaced further apart.

During the vacuum brazing, a weight can be placed on the silicon wafers to apply a pressure (e.g., 1-2 psi) to ensure the diamond coated surfaces of the silicon wafers and the second inner metal layer contact the braze at the melting point of the braze (e.g., 800-900 C). Grinding, polishing, and or etching techniques then remove the silicon wafers. As a result, the layers 57-61 form a free standing substrate.

Next, a first thin adhesion layer 56 coats the diamond layer 57 and a second thin adhesion layer 62 coats the diamond layer 61. The thin adhesion layers 56 and 62 can be NiCr, TiW, or Cr followed by a seed layer of copper (Cu) as described in Example 1. After coating, it can be plated to form the outer metal layers 55 and 63 as described in Example 1 with Cu, Ag, or a combination to the desired thickness using CTE matching equation (2). Additional plating, patterning, and segmenting can be implemented as described in Example 1.

EXAMPLE 6

The embodiment of the multilayered structure illustrated in FIG. 7 is made by bonding two structures made according to the techniques of Example 1. In FIG. 7, layers 70-72 bond the two structures (e.g., layers 65-69 and 73-77). The metal alloy layers 70 and 72 can be a braze alloy or a solder alloy such as AuSn. A second inner metal layer 71 such as copper foil is between metal alloys 70 and 72. If brazing, one can use the techniques of Example 2. If soldering, one can use the techniques of Example 3. Additional plating, patterning, and segmenting can be implemented as described earlier in Example 1.

EXAMPLE 7

Other embodiments of the multilayered structure can be achieved by substituting PVD deposition (e.g., sputtering, evaporation, or cathodic arc) for the plating steps.

EXAMPLE 8

Other embodiments of the multilayered structure can be made by growing CVD diamond doped with boron or some other suitable p-type dopant to make the diamond electrically conductive. This permits a CTE matched multilayered structure which is electrically conductive between the outer layers.

EXAMPLE 9

The embodiment of the multilayered structure illustrated in FIGS. 8A-8C can be made using the following methods.

A CVD diamond layer 203 is grown on a silicon wafer (not shown) using hot filament or any similar diamond deposition technology as described earlier. After diamond deposition, photolithography and conventional reactive ion etching or similar plasma enhanced etching can be used to make vias 214, 216 in diamond layer 203.

Alternatively, selective diamond growth can used to form the diamond layer 203 with the vias 214 and 216. Selective diamond growth can be accomplished using method(s) described in the Journal of Materials Engineering and Performance, Volume 3, Number 3, 378-385, DOI: 10.1007/BF02645335, Diamond and Related Materials 10, 2001, pp. 1573-1577, Selective deposition of diamond films on insulators by selective seeding with a double-layer mask, H. W. Liu1, C. X. Gao, X. Li, C. X. Wang, Y. H. Han, G. T. Zou, and Springer Handbook of Nanotechnology, Second Edition, Volume 2, p. 313, Springer 2006, which are incorporated by reference herein.

Next, the vias 214, 216, can be plated up to the surface of the diamond layer 203 with copper and/or silver or PVD used to deposit a metal layer on the diamond layer 203 and in the vias 214, 216. CMP can be used to planarize the metal in the vias 214, 216 with the top surface 209 of the diamond layer 203. Next, PVD can be used to deposit the thin adhesion layer 202 on the exposed surface of the diamond layer 203 and the metal filled vias 214, 216 followed by a seed metal layer. The seed metal layer can be then plated with Cu and/or Ag to form the metal layer 201.

Photolithography can be used to make electrically isolated metallized regions 206, 207 and 212 as shown in FIG. 8B before or after the plating step used to make metal layer 201. If before the plating step, photolithography can prevent plating in the spaces 208, 210 shown in FIG. 8A. If after the plating step, the photolithography protects electrically isolated metallized regions 206, 207, and 212 during an etch step that removes the metal layer 201 in the spaces 208, 210. In either case an etching step is used to remove the thin adhesion layer 202. The photolithography can be used to protect the electrically isolated metal regions 206, 207, and 212 for selective deposition of additional metal layers. For example, the metal region 207 can be masked and an AuSn solder and/or other metal layers deposited on the metal regions 206 and 212. The silicon wafer is removed by grinding, polishing, and or etching techniques.

The resulting structure of the diamond layer 203, the thin adhesion layer 202, and the metal layer 201 can be coated on the diamond side with a thin adhesion layer 204 such as NiCr, TiW, or Cr followed by a seed metal layer of Cu and/or Ag using sputtering or other PVD technology. The seed layer can be then plated with Cu and/or Ag to form the metal layer 205 to a desired thickness.

In an embodiment, the CTE matching equation (3) determines the thickness of the diamond layer and metal layers necessary to match the CTE of semiconductor or electronic components to be mounted on the metal layer 201 and/or metal layer 205. Photolithography can be used to make the electrically isolated metallized regions 222 and 224 shown in FIG. 8C, and before or after the plating step to pattern the metal layer 205. If before the plating step, photolithography prevents plating in the space 218 shown in FIGS. 8A and 8C. If after the plating step, the photomask protects electrically isolated metallized regions 222 and 224 during an etch step that removes the metal layer 205 within space 218. In either case, an etching step is used to remove the plating seed layer and thin adhesion layer 204. Additionally, photolithography can be used to protect either metal region 222 or 224 for selective deposition of additional metal layers to create regions of different CTE at the surface or to prepare the surface for mounting of semiconductor devices. For example, the metal region 222 can be masked and an AuSn solder and/or other metal layers deposited on the metal region 224.

After further plating the multilayered structure can be divided into smaller pieces (e.g., segmented) using laser and/or etching techniques to create individual multilayered structures which have electrically isolated metal paths between the two outer conductive surfaces through the vias 214 and 216 in the intervening electrically insulating diamond layer. In an embodiment, the multilayered structure can replace a silicon interposer with through silicon vias (TSV) for three-dimensional chip packaging when two or more chips are stacked with thermal heat spreaders between the chips to allow heat to move from one chip through the second chip to the package heat sink.

EXAMPLE 10

The embodiment of the multilayered structure illustrated in FIGS. 9A-9C can be made using the methods of example 10. Example 1 and 9 describe suitable processes to deposit or grow the CVD diamond layer 303. In this embodiment, a dielectric (e.g., diamond) layer 311 is grown on a silicon wafer (not shown) and patterned using photolithography and etched. The dielectric material(s) between isolated metal regions may include any suitable dielectric in the semiconductor industry such as silicon nitride, silicon dioxide, silicon oxynitride, or a thermally conductive material such as aluminum oxide, aluminum nitride, or beryllium oxide. The dielectric material(s) may be in the form of mixed composites, multilayered films of different compositions, or single layers of a single composition.

Next, PVD can be used to deposit a thin adhesion metal layer (not shown) and a seed layer of metal (e.g., copper or silver) on the exposed surface of the dielectric layer 311 and the silicon wafer. A metal (e.g. copper or silver) layer 305 can be deposited on the seed layer of metal. In an alternative embodiment, PVD deposits the metal layer 305 on the exposed surface of the dielectric layer 311 and the silicon wafer.

In either embodiment, CMP can be used to planarize the metal layer 305 with the top surface of dielectric layer 311 forming regions 310 and 312. PVD can be used to deposit the thin adhesion layer 304 on the metal layer 305 and dielectric layer 311. Photolithography and etching can be used to remove the thin adhesion layer 304 except in the metal regions 310 and 312. Diamond is then deposited on thin adhesion layer 304 and dielectric layer 311 to form a diamond layer 303. Photolithography and etching can then be used to form via 314 and via 315 in the diamond layer 303.

Alternatively, selective diamond growth can used to form the diamond layer 303 with the vias 314 and 315. Selective diamond growth can be accomplished using one or more of the methods described in the Journal of Materials Engineering and Performance, Volume 3, Number 3, 378-385, DOI: 10.1007/BF02645335, Diamond and Related Materials 10, 2001, pp. 1573-1577, Selective deposition of diamond films on insulators by selective seeding with a double-layer mask, H. W. Liu1, C. X. Gao, X. Li, C. X. Wang, Y. H. Han, G. T. Zou, or Springer Handbook of Nanotechnology, Second Edition, Volume 2, p. 313, Springer 2006, which are incorporated by reference herein.

Next, the vias are plated up to the surface of the diamond layer with copper or silver plating or PVD deposits a copper and/or silver metal layer on the diamond layer 303 and in the vias 314 and 315. CMP can be used to planarize the metal layer with the top surface 319 of diamond layer 303 to form metal filled vias 314 and 315. Another dielectric layer (e.g. diamond) is then deposited on surface 319 of the diamond layer 303 and the metal filled vias 314 and 315. Photolithography and plasma etching is used to pattern this layer into dielectric regions 308 and 316. Next, PVD deposits thin adhesion layer 302 and a seed layer of metal (e.g., copper or silver) on the exposed surface of the diamond layer 303, the metal filled vias 314 and 315 and dielectric regions 308 and 316. Copper or silver plating is then used to grow a metal layer 301 on the seed metal layer.

In an alternative embodiment, PVD deposits a thin adhesion layer 302 and metal layer 301 on the exposed surface of the diamond layer 303, the metal filled vias 314 and 315, and the dielectric regions 308 and 316.

In either embodiment CMP can be used to planarize the metal layer 301 and thin adhesion layer 302 with the top surface of dielectric regions 308 and 316 forming isolated metal regions 306, 307 and 312. The silicon wafer is then removed from the multilayer structure by etching, grinding, polishing or a combination thereof and the thin adhesion layer on the outer surface of metal layer 305 if present is removed by etching.

The thin adhesion layers 302 and 304 can be NiCr, TiW, or Cr as described in Example 1. The metal layers in this example could be copper and/or silver. In an embodiment, the CTE matching equation (3) determines the thickness of the metal layers 301 and 305 and the diamond layer 303. Additional plating, patterning, and segmenting can be implemented as described in Example 1 and Example 9.

EXAMPLE 11

The embodiment of the multilayered structure illustrated in FIGS. 10A-10D can be made using the following method.

A CVD diamond layer 407 is grown on a silicon wafer (not shown) using hot filament or any similar diamond deposition technology as described earlier. After diamond deposition, photolithography and conventional reactive ion etching or similar plasma enhanced etching can be used to make via 415 in diamond layer 407. Alternatively, selective diamond growth can used to form the diamond layer 407 with via 413. Selective diamond growth can be accomplished using one or more of the methods described in the Journal of Materials Engineering and Performance Volume 3, Number 3, 378-385, DOI: 10.1007/BF02645335, Diamond and Related Materials 10, 2001, pp. 1573-1577, Selective deposition of diamond films on insulators by selective seeding with a double-layer mask, H. W. Liu1, C. X. Gao_, X. Li, C. X. Wang, Y. H. Han, G. T. Zou, or Springer Handbook of Nanotechnology, Second Edition, Volume 2, p313, Springer 2006, which are incorporated by reference herein.

Next, the via 415 is plated up to the surface of the diamond layer 407 with copper and/or silver or PVD is used to deposit a metal layer on the diamond layer 407 and in the via 415. CMP can be used to planarize the metal layer with the top surface of diamond layer 407 to form metal filled via 415.

A dielectric (e.g. diamond) layer is then grown on the surface of the diamond layer 407 and the metal filled via 415. Photolithography and plasma etching is used to pattern this layer into dielectric region 414. Next, PVD deposits thin adhesion layer 406 and a seed layer of metal (e.g., copper or silver) on the exposed surface of the diamond layer 407, metal filled via 415, and dielectric region 414. Copper or silver plating is then used to grow a metal layer 405 on the seed layer of metal.

In an alternative embodiment, PVD deposits thin adhesion layer 406 and metal layer 405 on the exposed surface of the diamond layer 407, metal filled via 415, and dielectric region 414.

In either embodiment CMP can be used to planarize the metal layer 405 and thin adhesion layer 406 with the top surface of dielectric region 414 forming isolated metal regions 419 and 420.

Then PVD is used to deposit the thin adhesion layer 404 on the metal layer 405 and dielectric layer 414. Photolithography and etching is used to remove the thin adhesion layer 404 except in the metal regions 419 and 420.

Diamond is then deposited on thin adhesion layer 404 and dielectric layer 414 to form a diamond layer 403. Photolithography and etching can be used to form via 413 in the diamond layer 403. Alternatively, selective diamond growth can used to form the diamond layer 403 with the via 413. Next, the via is plated up to the surface of the diamond layer with copper and/or silver plating or PVD deposits a metal layer on the diamond layer 403 and in the via 413. CMP can be used to planarize the metal layer with the top surface 430 of diamond layer 403 to form metal filled via 413.

Next, PVD deposits thin adhesion layer 402 and a seed layer of metal (e.g., copper or silver) on the exposed surface of the diamond layer 403 and metal filled via 413 followed by a seed layer metal (e.g., copper and/or silver). Copper and/or silver plating is then used to grow a metal layer 401 on the seed layer of metal.

In an alternative embodiment, PVD deposits thin adhesion layer 402 and metal layer 401 on the exposed surface of the diamond layer 403 and the metal filled via 413.

Photolithography can be used to make electrically isolated metal regions 410 and 412 as shown in FIG. 10B either before or after the plating step used to make metal layer 401. If before the plating step, photolithography prevents plating in space 411 shown in FIG. 10A. If after the plating or the PVD deposition of metal layer 401, the photolithography protects electrically isolated metal regions 410 and 412 during an etch step that removes metal layer 401 in space 411. In either case an etching step is used to remove the thin adhesion layer 402. The photolithography can be used to protect metal region 410 or 412 for selective deposition of additional metal layers to create regions of different CTE at the surface or to prepare the surface for mounting of semiconductor devices. For example, the region 412 can be masked and an AuSn solder and/or other metal layers deposited on the metal region 410. The silicon wafer (not shown) is removed by grinding, polishing, and or etching techniques.

Then PVD deposits thin adhesion layer 408 followed by a seed metal on the exposed surface 432 of the diamond layer 407 and metal filled via 415. The seed layer can be then plated with Cu and/or Ag to form the metal layer 409 to a desired thickness using the CTE matching equation (4) so as to match an electronic component to be mounted on it.

In an alternative embodiment, PVD deposits the thin adhesion layer 408 and metal layer 409 on the exposed surface 432 of the diamond layer 407 and metal filled via 415.

The method of making the multilayered structure can use photolithography to make electrically isolated metal regions 416 and 417 as shown in FIG. 10D. Photolithography can be used before or after the plating step to make metal layer 409. If before the plating step, photolithography prevents plating in space 421 shown in FIG. 10D. If after the plating step or the PVD deposition of metal layer 409, photolithography protects electrically isolated metal regions 416 and 417 during an etch step that removes metal layer 409 in isolation space 421. In either case etching is used to remove the seed metal layer and the thin adhesion layer 408. Photolithography can be used to protect either metal region 416 or 417 for selective deposition of additional metal layers to create regions of different CTE at the surface or to prepare the surface for mounting of semiconductor devices. For example, the metal region 417 can be masked and an AuSn solder and/or other metal layers deposited on the metal region 416.

In an embodiment, the CTE matching equation (4) determines the thickness of the metal layers 401, 405 and 409 and the diamond layers 403 and 407.

After the further plating the multilayered structure can be divided into smaller pieces (e.g., segmented) using laser and/or etching techniques to create individual multilayered structures which have electrically isolated metal paths between the two outer conductive surfaces through vias 413 and 415 in the intervening electrically insulating diamond layers.

EXAMPLE 12

The embodiment of the multilayered structure illustrated in FIGS. 11A-11D can be made by growing CVD diamond as described in Example 1. Referring to FIG. 11A, in this embodiment, a dielectric (e.g., diamond) layer 422 is grown on a silicon wafer (not shown) and the dielectric layer 422 is patterned using photolithography and etched as shown in FIG. 11D. Next, PVD can be used to deposit a thin adhesion metal layer (not shown) and a seed layer of metal (e.g., copper or silver) on the exposed surface of the dielectric layer 422 and the silicon wafer. A metal (e.g. copper or silver) layer 409 can be deposited on the seed layer of metal.

In an alternative embodiment, PVD deposits the metal layer 409 on the exposed surface of the dielectric layer 422 and the silicon wafer.

In either embodiment, CMP can be used to planarize the metal layer 409 with the top surface of dielectric layer 422 forming metal regions 416 and 417. PVD can be used to deposit the thin adhesion layer 408 on the metal layer 409 and the dielectric layer 422. Photolithography and etching can then be used to remove the thin adhesion layer 408 except in metal regions 416 and 417.

Diamond is then deposited on thin adhesion layer 408 and dielectric layer 422 to form a diamond layer 407. Photolithography and etching then form via 415 in the diamond layer 407.

Alternatively, selective diamond growth can used to form the diamond layer 407 with the via 415. Selective diamond growth can be accomplished using one or more of the methods described in the Journal of Materials Engineering and Performance, Volume 3, Number 3, 378-385, DOI: 10.1007/BF02645335, Diamond and Related Materials 10, 2001, pp. 1573-1577, Selective deposition of diamond films on insulators by selective seeding with a double-layer mask, H. W. Liu1, C. X. Gao, X. Li, C. X. Wang, Y. H. Han, G. T. Zou, or Springer Handbook of Nanotechnology, Second Edition, Volume 2, p. 313, Springer 2006, which are incorporated by reference herein.

Next, the vias are plated up to the surface of the diamond layer with copper or silver plating or PVD deposits a metal layer on the diamond layer 407 and in the via 415. CMP can be used to planarize the metal with the top surface of the diamond layer 407 to form metal filled via 415. Another dielectric layer (e.g. diamond) is then deposited on the surface of the diamond layer 407 and the metal filled via 415. Photolithography and plasma etching is used to pattern this layer into dielectric region 414 (FIG. 11C). Next, PVD deposits thin adhesion layer 406 and a seed layer of metal (e.g., copper or silver) on the exposed surface of the diamond layer 407, metal filled via 415, and dielectric region 414. Copper or silver plating is then used to grow a metal layer 405 on the seed metal layer.

In an alternative embodiment, PVD deposits a thin adhesion layer 406 and metal layer 405 on the exposed surface of the diamond layer 407, the metal filled via 415, and the dielectric region 414. In either embodiment CMP can be used to planarize the metal layer 405 and thin adhesion layer 406 with the top surface of dielectric region 414 forming isolated metal regions 419 and 420 (FIG. 11C).

PVD is used to deposit the thin adhesion layer 404 on the metal layer 405 and dielectric layer 414. Photolithography and etching is used to remove the thin adhesion layer 404 except in the metal regions 419 and 420.

Diamond is then deposited on thin adhesion layer 404 and dielectric layer 414 to form a diamond layer 403. Photolithography and etching can be used to form via 413 in the diamond layer 403. Alternatively, selective diamond growth can used to form the diamond layer 403 with the via 413. Next, the vias are plated up to the surface of the diamond layer 403 with copper or silver plating or PVD deposits a metal layer on the diamond layer 403 and in the via 413. CMP can be used to planarize the metal layer with the top surface 430 of diamond layer 403 to form metal filled via 413. Another dielectric layer (e.g. diamond) is then grown on the surface of the diamond layer 403 and the metal filled via 413. Photolithography and plasma etching is used to pattern the dielectric layer into region 423. Next, PVD deposits a thin adhesion layer 402 and a seed layer of metal (e.g., copper or silver) on the exposed surface of the diamond layer 403, the metal filled via 413, and dielectric region 423. Copper or silver plating is then used to grow a metal layer 401 on the seed layer of metal.

In an alternative embodiment, PVD deposits thin adhesion layer 402 and metal layer 401 on the exposed surface 430 of the diamond layer 403, the metal filled via 413, and the dielectric region 423.

In either embodiment CMP can be used to planarize the metal layer 401 and thin adhesion layer 402 with the top surface of dielectric region 423 forming isolated metal regions 410 and 412 The silicon wafer is then removed from the multilayer structure by etching, grinding, polishing or a combination thereof and the thin adhesion layer on the outer surface of metal layer 409 if present is removed by etching.

The thin adhesion layers 402, 404, 406, and 408 can be NiCr, TiW, or Cr as described in Example 1. The metal layers in this example could be copper and/or silver. In an embodiment, the CTE matching equation (4) determines the thickness of the metal layers 401, 405, 409 and diamond layers 403 and 407. Additional plating, patterning, and segmenting can be implemented as described in Examples 1, 9, and 11.

EXAMPLE 13

FIG. 12 depicts a stack of two multilayered structures shown in FIGS. 9A-9C that are bonded (e.g., soldered) together. The methods of Example 10 can be used to make each multilayered structure.

To bond the multilayered structures, we can use PVD, plating, or solder technology to deposit a metal layer 506 on one or both mating surfaces of the multilayered structures. Photolithography is used to pattern the solder to cover matching regions on each multilayered structure then align and heat the multilayered structures to a temperature sufficient to melt the solder and form the stack of multilayered structures as shown in FIG. 12. The solder alloy is selected from a group of metals consisting of silver, gold, tin, indium, germanium, lead, antimony, bismuth, palladium and/or silicon. Additional plating, patterning, and segmenting can be implemented as described in Example 1.

What is claimed:

1. A multilayered structure, comprising:
a diamond layer having a top surface and a bottom surface with one or more metal filled vias in the diamond layer;
a first thin adhesion layer on the top surface;
a second thin adhesion layer on the bottom surface;
a first metal layer having a thermal conductivity greater than 200 W/m-K and a coefficient of thermal expansion greater than 12 ppm/K, wherein the first metal layer is deposited on the first thin adhesion layer; and
a second metal layer having a thermal conductivity greater than 200 W/m-K and a coefficient of thermal expansion greater than 12 ppm/K, wherein the second metal layer is deposited on the second thin adhesion layer, wherein a CTE matching equation determines the thickness of the diamond layer, the first metal layer, and the second metal layer such that the CTE of the multilayered structure matches the CTE of a semiconductor, wherein the thickness of each of the first and second thin adhesion layers is less than 10% compared to thickness of each of the first and second metal layers.

2. The multilayered structure of claim 1, wherein the coefficient of thermal expansion at the surface of the first and/or second metal layer is greater than that of the diamond layer and less than that of the first metal layer and the second metal layer.

3. The multilayered structure of claim 1, wherein the value of the coefficient of thermal expansion at the surface of the first metal layer is determined by the ratio of the thicknesses, the Young's modulus and the coefficients of thermal expansion of the first and/or second metal layer, the second metal layer, and the diamond layer.

4. The multilayered structure of claim 1, wherein the thickness of the diamond layer is determined by the following equation:

$$t_D = t_{M1} \times (E_D/E_{M1}) \times ((CTE_{M1} - CTE_C)/(CTE_C - CTE_D)) + t_{M2} \times (E_D/E_{M2}) \times ((CTE_{M2} - CTE_C)/(CTE_C - CTE_D)),$$

wherein as follows:
$t_D$ = thickness of the diamond layer
$t_{M1}$ = thickness of the first metal layer
$t_{M2}$ = thickness of the second metal layer
$E_D$ = Young's modulus of the diamond layer
$E_{M1}$ = Young's modulus of the first metal layer
$E_{M2}$ = Young's modulus of the second metal layer
$CTE_D$ = coefficient of thermal expansion of the diamond layer with one or more vias
$CTE_{M1}$ = coefficient of thermal expansion of the first metal layer that may include electrically isolated regions and dielectric material(s)
$CTE_{M2}$ = coefficient of thermal expansion of the second metal layer that may include electrically isolated regions and dielectric material(s)
$CTE_C$ = coefficient of thermal expansion for surface of the multilayered structure.

5. The multilayered structure of claim 1, wherein the first metal layer and the second metal layer are the outermost layers of the multilayer structure.

6. The multilayered structure of claim 1, wherein additional layers of metal are deposited on the first and/or second metal layer(s) to facilitate attachment of an electronic or optical component on one or both sides.

7. The multilayered structure of claim 1, wherein the first and/or second metal layer and the first and/or second thin adhesion layer are patterned into electrically isolated regions wherein one or more regions in the first or second metal layers are connected through metal filled vias to one or more different electrically isolated regions in the first or second metal layers.

8. The multilayered structure of claim 1, wherein the first metal layer includes a plurality of regions, wherein each region has a different coefficient of thermal expansion based on the thickness or the composition of the first metal layer or the thickness of the diamond layer.

9. The multilayered structure of claim 7 where a dielectric material(s) fills the space between electrically isolated metal regions.

10. The multilayered structure of claim 9 where the dielectric material(s) are diamond.

11. The multilayer structure of claim 7, wherein the connections between electrically isolated regions on the first and second metal layers are used to facilitate connecting two semiconductor devices which are attached to either side of the multilayer structure.

12. A multilayered structure, comprising:
an inner metal layer having a thermal conductivity greater than 200 W/m-K and a coefficient of thermal expansion greater than 12 ppm/K;
a first diamond layer with one or more metal filled vias;
a first inner thin adhesion layer disposed between the first diamond layer and the inner metal layer;
a second diamond layer with one or more metal filled vias;
a second inner thin adhesion layer disposed between the second diamond layer and the inner metal layer;
a first outer thin adhesion layer on the top surface of the first diamond layer;
a second outer thin adhesion layer on the bottom surface of the second diamond layer;
a first outer metal layer having a thermal conductivity greater than 200 W/m-K and a coefficient of thermal expansion greater than 12 ppm/K, wherein the first outer metal layer is deposited on the first outer thin adhesion layer; and a second outer metal layer having a thermal conductivity greater than 200 W/m-K and a coefficient of thermal expansion greater than 12 ppm/K, wherein the second outer metal layer is deposited on the second outer thin adhesion layer, wherein a CTE matching equation determines:

the thickness of the first diamond layer, the first outer metal layer, and the inner metal layer, the thickness of the second diamond layer, and the second outer metal layer, wherein the thickness of each of the first and second inner thin adhesion layers is less than 10% compared to the thickness of inner metal layer and wherein the thickness of each of the first and second outer thin adhesion layers is less than 10% compared to thickness of each of the first and second outer metal layers.

13. The multilayered structure of claim 12, wherein the inner metal layer includes:

a first inner metal layer having a thermal conductivity greater than 200 W/m-K and a coefficient of thermal expansion greater than 12 ppm/K, and a second inner metal layer having a thermal conductivity greater than 200 W/m-K and a coefficient of thermal expansion greater than 12 ppm/K, a solder alloy having a thermal conductivity greater than 50 W/m-K and a coefficient of thermal expansion greater than 12 ppm/K between the first and second inner metal layers.

14. The multilayered structure of claim 13, wherein the solder alloy is selected from a group of metals consisting of silver, gold, tin, indium, germanium, lead, antimony, bismuth, palladium and/or silicon.

15. The multilayered structure of claim 12, wherein the following equation determines the thickness of each of the first and second diamond layers:

$$t_D = t_{M1} \times (E_D/E_{M1}) \times ((CTE_{M1}-CTE_C)/(CTE_C-CTE_D)) + t_{M2} \times (E_D/E_{M2}) \times ((CTE_{M2}-CTE_C)/(CTE_C-CTE_D))$$ wherein as follows:

$t_D$=thickness of each of the first and second diamond layers
$t_{M1}$=thickness of the first outer metal layer
$t_{M2}$=thickness of the second outer metal layer
$E_D$=Young's modulus of the first diamond layer
$E_{M1}$=Young's modulus of first outer metal layer
$E_{M2}$=Young's modulus of the second outer metal layer
$CTE_D$=coefficient of thermal expansion of the first and the second diamond layers with the one or more vias
$CTE_{M1}$=coefficient of thermal expansion of first outer metal layer that may include electrically isolated regions and dielectric material(s)
$CTE_{M2}$=coefficient of thermal expansion of second outer metal layer that may include electrically isolated regions and dielectric material(s)
$CTE_C$=coefficient of thermal expansion for surface of multilayered structure.

16. The multilayered structure of claim 12, wherein additional layers of metal are deposited on the top and/or bottom surface to facilitate attachment of an electronic or optical component to one or both sides.

17. The multilayered structure of claim 12, wherein the inner and/or outer metal layers include a plurality of electrically isolated regions.

18. The multilayered structure of claim 12, wherein the first metal layer includes a plurality of isolated regions, wherein each region has a different coefficient of thermal expansion based on the thickness or the composition of the first outer metal layer or the thickness of the first diamond layer.

19. The multilayered structure of claim 17, wherein one or more of the plurality of regions in the first and/or second outer metal layers are connected through metal filled vias in the diamond layers to one or more electrically isolated regions in the inner metal layer.

20. The multilayered structure of claim 17, wherein a dielectric material(s) fill one or more of the spaces between electrically isolated regions.

21. The multilayered structure of claim 19, wherein dielectric material(s) fill one or more of the spaces between electrically isolated regions.

22. The multilayer structure of claim 19, wherein the electrically isolated regions of the outer metal layers are adapted to connect to one or more semiconductor devices.

23. A method of making a multilayered structure, comprising:

growing a diamond layer on a substrate, wherein the bottom surface of the diamond rests on the substrate;

removing selected regions of the diamond layer completely;

applying a via metal layer on the top surface of the diamond layer and the regions of the substrate exposed by the diamond removal;

removing the via metal layer from the top surface of the diamond layer to create a metal filled via in the diamond layer.

applying a first thin adhesion layer on the top surface of the diamond layer and the metal filled vias in the diamond layer;

applying a first metal layer on the first thin adhesion layer;

removing selected regions of the first metal and first thin adhesion layers to create electrically isolated regions, some of which contact the metal filled vias;

removing the substrate;

applying a second thin adhesion layer on the bottom surface of the diamond layer; and applying a second metal layer on the second thin adhesion layer.

removing selected regions of the second metal and second thin adhesion layers to create electrically isolated regions, some of which contact the metal filled vias.

24. The method of claim 23, wherein selective diamond growth is used to form the vias in the diamond layer rather than removing the diamond in the via regions after growth.

25. A method of making a multilayered structure, comprising:

applying a dielectric layer to a substrate;

removing selected regions of the dielectric layer completely;

applying a third thin adhesion layer to the surface of the dielectric layer and the exposed surface of the substrate;

applying a second metal layer on the surface of the thin adhesion layer;

removing the second metal and third adhesion layers from the top surface of the dielectric layer to create electrically isolated regions of metal;

applying a second thin adhesion layer to the electrically isolated metal regions growing a diamond layer on the top surface of the electrically isolated metal regions and the dielectric regions.

removing selected regions of the diamond layer completely;

applying a via metal layer on the top surface of the diamond layer and the regions of the second thin adhesion layer exposed by the diamond removal;

removing the via metal layer from the top surface of the diamond layer to create a metal filled via in the diamond layer.
    applying another dielectric layer to the top surface of the diamond layer and metal filled vias;
removing selected regions of the dielectric layer completely;
applying a first thin adhesion layer to the surface of the dielectric layer and the exposed surface of the diamond layer and the metal filled vias;
applying a first metal layer on the surface of the first thin adhesion layer;
removing the metal and adhesion layers from the top surface of the dielectric layer to create electrically isolated regions of metal, some of which contact the metal filled vias;
removing the substrate; and
removing the third thin adhesion layer.

26. The method of claim 25, wherein the dielectric layers are diamond.

27. The method of claim 25, wherein selective diamond growth is used to form the vias in the diamond layer rather than removing the diamond in the via regions after growth.

28. The method of claim 26, wherein selective diamond growth is used to form some or all of the patterned regions in the diamond layers rather than removing the diamond in the selected regions after growth.

29. A method of making a multilayered structure, comprising:
growing a second diamond layer on a substrate, wherein the bottom surface of the diamond rests on the substrate;
removing selected regions of the second diamond layer completely;
applying a via metal layer on the top surface of the diamond layer and the regions of the substrate exposed by the diamond layer removal;
removing the via metal layer from the top surface of the diamond layer to create one or more metal filled vias in the diamond layer.
applying a dielectric layer to the second diamond layer and metal filled vias;
removing selected regions of the dielectric layer completely;
applying a second inner thin adhesion layer to the surface of the dielectric layer and the exposed surface of the second diamond layer and metal filled vias;
applying an inner metal layer on the surface of the second inner thin adhesion layer;
removing the inner metal and second inner thin adhesion layers from the top surface of the dielectric layer to create electrically isolated regions of metal;
applying a first inner thin adhesion layer to the electrically isolated metal regions;
growing a first diamond layer on the top surface of the electrically isolated metal regions and the dielectric regions;
removing selected regions of the first diamond layer completely;
applying another via metal layer on the top surface of the diamond layer and the regions of the thin adhesion layer exposed by the diamond removal;
removing the metal layer from the top surface of the diamond layer to create one or more metal filled vias in the diamond layer;
applying a first outer thin adhesion layer on the top surface of the diamond layer and the metal filled vias in the diamond layer;
applying a first outer metal layer on the first thin adhesion layer;
removing selected regions of the first outer metal and first outer thin adhesion layers to create electrically isolated regions, some of which contact the metal filled vias;
removing the substrate;
applying a second outer thin adhesion layer on the bottom surface of the diamond layer;
applying a second outer metal layer on the second thin adhesion layer; and
removing selected regions of the second metal and second thin adhesion layers to create electrically isolated regions, some of which contact the metal filled vias.

30. The method of claim 29, wherein the dielectric layer is diamond.

31. The method of claim 29, wherein selective diamond growth is used to form the vias in the diamond layers rather than removing the diamond in the via regions after growth.

32. The method of claim 30, wherein selective diamond growth is used to form some or all of the patterned regions in the diamond layers rather than removing the diamond in these regions after growth.

33. A method of making a multilayered structure, comprising: stacking a plurality of multilayered structures using the method of claim 24 or claim 25 by
bonding the top surface of the first multilayer structure to the top surface of the second multilayer structure; and
removing the first and second substrates.

34. A method of making a multilayered structure, comprising:
applying a dielectric layer to a substrate;
removing selected regions of the dielectric layer completely;
applying a third outer thin adhesion layer to the surface of the dielectric and the exposed surface of the substrate;
applying a second outer metal layer on the surface of the thin adhesion layer;
removing the second outer metal and third outer thin adhesion layers from the top surface of the dielectric layer to create electrically isolated regions of metal;
applying a second outer thin adhesion layer to the electrically isolated metal regions;
growing a second diamond layer on the top surface of the electrically isolated metal regions and the dielectric regions;
removing selected regions of the second diamond layer completely;
applying a via metal layer on the top surface of the diamond layer and the regions of the second outer thin adhesion layer exposed by the diamond removal;
removing the via metal layer from the top surface of the second diamond layer to create one or more metal filled vias in the second diamond layer;
applying another dielectric layer to the top surface of the second diamond layer and metal filled vias;
removing selected regions of the dielectric layer completely;
applying a second inner thin adhesion layer to the surface of the dielectric layer and the exposed surface of the second diamond layer and metal filled vias;
applying an inner metal layer on the surface of the second inner thin adhesion layer;
removing the inner metal and second inner adhesion layers from the top surface of the dielectric layer to create electrically isolated regions of metal;
applying a first inner thin adhesion layer to the electrically isolated metal regions growing a first diamond layer on the top surface of the electrically isolated metal regions and the dielectric regions;

removing selected regions of the first diamond layer completely;

applying a via metal layer on the top surface of the diamond layer and the regions of the first inner thin adhesion layer exposed by the diamond removal;

removing the via metal layer from the top surface of the first diamond layer to create one or more metal filled vias in the diamond layer;

applying a dielectric layer to the top surface of the first diamond layer and metal filled vias;

removing selected regions of the dielectric layer completely;

applying a first outer thin adhesion layer to the surface of the dielectric layer and the exposed surface of the first diamond layer and metal filled vias;

applying a first outer metal layer on the surface of the first outer thin adhesion layer;

removing the first outer metal and first outer thin adhesion layers from the top surface of the dielectric layer to create electrically isolated regions of metal, some of which contact the metal filled vias;

removing the substrate; and removing the third outer adhesion layer.

35. The method of claim 34, wherein one or more of the dielectric layers are diamond.

36. The method of claim 34, wherein selective diamond growth is used to form the vias in the diamond layers rather than removing the diamond in the via regions after growth.

37. The method of claim 35, wherein selective diamond growth is used to form some or all of the patterned regions in the diamond layers rather than removing the diamond in these regions after growth.

* * * * *